(12) United States Patent
Toba et al.

(10) Patent No.: US 7,767,522 B2
(45) Date of Patent: Aug. 3, 2010

(54) SEMICONDUCTOR DEVICE AND A METHOD OF MANUFACTURING THE SAME

(75) Inventors: Koichi Toba, Tokyo (JP); Yasushi Ishii, Tokyo (JP); Yoshiyuki Kawashima, Tokyo (JP); Satoru Machida, Tokyo (JP); Munekatsu Nakagawa, Tokyo (JP); Takashi Hashimoto, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 554 days.

(21) Appl. No.: 11/715,348

(22) Filed: Mar. 8, 2007

(65) Prior Publication Data

US 2007/0228498 A1    Oct. 4, 2007

(30) Foreign Application Priority Data

Apr. 4, 2006    (JP)    ............ 2006-103464

(51) Int. Cl.
H01L 21/336    (2006.01)
(52) U.S. Cl. .................... 438/257; 438/261
(58) Field of Classification Search ............ 438/257, 438/261
See application file for complete search history.

(56) References Cited

U.S. PATENT DOCUMENTS

2005/0085039 A1    4/2005    Yasui et al.

FOREIGN PATENT DOCUMENTS

JP    2002-231829 A    8/2002

*Primary Examiner*—Long Pham
(74) *Attorney, Agent, or Firm*—Miles Stockbridge P.C.

(57) ABSTRACT

Provided is a semiconductor device having, over a semiconductor substrate, a control gate electrode and a memory gate electrode which are adjacent to each other and constitute a nonvolatile memory. The height of the memory gate electrode is lower than the height of the control gate electrode. A metal silicide film is formed over the upper surface of the control gate electrode, but not formed over the upper surface of the memory gate electrode. The memory gate electrode has, over the upper surface thereof, a sidewall insulating film made of silicon oxide. This sidewall insulating film is formed in the same step as that for the formation of respective sidewall insulating films over the sidewalls of the memory gate electrode and the control gate electrode. The present invention makes it possible to improve the production yield and performance of the semiconductor device having a nonvolatile memory.

9 Claims, 17 Drawing Sheets

FIG. 4

| APPLIED VOLTAGE<br>OPERATION | Vd | Vcg | Vmg | Vs | Vb |
|---|---|---|---|---|---|
| PROGRAM | 1V | Vdd | 12V | 6V | 0 |
| ERASE | 0 | 0 | -6V | 6V | 0 |
| READ | Vdd | Vdd | Vdd | 0 | 0 |

Vdd=1.5V

SEMICONDUCTOR DEVICE AND A METHOD OF MANUFACTURING THE SAME

CROSS-REFERENCE TO RELATED APPLICATIONS

The disclosure of Japanese Patent Application No. 2006-103464 filed on Apr. 4, 2006 including the specification, drawings and abstract is incorporated herein by reference in its entirety.

BACKGROUND OF THE INVENTION

The present invention relates to a semiconductor device and a manufacturing method thereof, in particular, a technology effective when applied to a semiconductor device having a nonvolatile memory and a manufacturing method thereof.

As an electrically programmable and erasable nonvolatile semiconductor memory device, EEPROM (Electrically Erasable and Programmable Read Only Memory) has been employed widely. Such a memory device (memory) typified by a flash memory which is used popularly now has, below a gate electrode of its MISFET, a conductive floating gate electrode encompassed by an oxide film or a charge trap insulating film. With the charge accumulation state in the floating gate or charge trap insulating film as memory data, the device reads them as the threshold value of the transistor. This charge trap insulating film is an insulating film capable of accumulating charges therein and one example of it is a silicon nitride film. By injection of charges into a charge accumulation region or release therefrom, the threshold value of the MISFET is shifted to get the memory device to work. As this flash memory, a split gate cell using an MONOS (Metal-Oxide-Nitride-Oxide-Semiconductor) film can be given as one example. In such a memory, use of a silicon nitride film as a charge accumulation region is advantageous, because compared with a conductive floating gate film, it accumulates charges discretely so that it is excellent in the reliability of data retention. In addition, owing to excellent reliability of data retention, oxide films laid over and below the silicon nitride film can be thinned, making it possible to decrease the voltage for program and erase operations.

Japanese Patent Laid-Open No. 2002-231829 describes a technology of forming a select gate electrode over the surface of a channel region via a first gate insulating film, forming a sidewall-like control gate electrode over the side surface of the select gate electrode via a gate isolation insulating film while having a predetermined height difference between the control gate electrode and select gate electrode, and forming silicide layers over the surfaces of these gate electrodes, respectively, whereby these silicide layers formed over the respective gate electrodes can be insulated while spacing them closely, that is, without spacing them apart because there is a height difference between the control gate electrode and select gate electrode.

SUMMARY OF THE INVENTION

The investigation by the present inventors has revealed the following.

A split gate nonvolatile memory using an MONOS film has a structure in which a control gate electrode and a memory gate electrode are adjacent to each other; the control gate electrode has therebelow a silicon oxide film as a gate insulating film; the memory gate electrode has therebelow an ONO (Oxide-Nitride-Oxide) film; and the ONO film extends even between the memory gate electrode and the control gate electrode adjacent thereto. Accordingly, the control gate electrode and memory gate electrode are isolated by the ONO film.

Formation of a metal silicide film such as cobalt silicide over the upper surfaces of the control gate electrode and memory gate electrode can be given as one measure for reducing the resistance between the control gate electrode and memory gate electrode, thereby increasing the speed of the memory operation. According to the investigation by the present inventors, however, when metal silicide films are formed over the upper surfaces of the control gate electrode and memory gate electrode, a short-circuit fault between the control gate electrode and memory gate electrode may presumably occur because owing to small thickness of the ONO film, the end portion of the metal silicide film over the control gate electrode domes close to the end portion of the metal silicide film over the memory gate electrode. The short circuit between the control gate electrode and memory gate electrode occurs, depending on the formation state of the respective metal silicide films over the control gate electrode and memory gate electrode. It occurs when the metal silicide film over the control gate electrode comes close, in the bridge form, to the metal silicide film over the memory gate electrode. A semiconductor device having such a short circuit fault must be selected and eliminated in the test during the fabrication of the semiconductor device. This deteriorates the production yield of the semiconductor device and heightens its cost (unit price).

One measure for preventing such a drawback is not to form any metal silicide film over each of the control gate electrode and the memory gate electrode. It improves the withstand voltage between the control gate electrode and memory gate electrode and prevents occurrence of a short-circuit fault, but the control gate electrode and memory gate electrode without the metal silicide film thereover have a high resistance, resulting in lowering of the speed of memory operation. This may deteriorate the performance of a semiconductor device.

An object of the present invention is to provide a technology capable of improving the production yield of a semiconductor device.

Another object of the present invention is to provide a technology capable of improving the performance of the semiconductor device.

The above-described objects, other objects and novel features of the present invention will be apparent from the description herein and accompanying drawings.

Outline of the typical inventions, of the inventions disclosed by the present application, will next be described briefly.

In one aspect of the present invention, there is thus provided a semiconductor device, which comprises a first gate electrode and a second gate electrode which are formed over a semiconductor substrate and adjacent to each other; a first insulating film formed between the first gate electrode and the semiconductor substrate; and a second insulating film formed between the second gate electrode and the semiconductor substrate and between the first gate electrode and the second gate electrode and having a charge accumulator portion inside of the second insulating film; wherein a metal silicide film is formed over the upper surface of the first gate electrode, while no metal silicide film is formed at the end portion and nearby region thereof, on the side of the first gate electrode, of the surface of the second gate electrode not in contact with the second insulating film.

In another aspect of the present invention, there is also provided a manufacturing method of a semiconductor device, which comprises the steps of: (a) forming a first gate insulating film over the main surface of a semiconductor substrate via a first insulating film; (b) forming, over the main surface of the semiconductor substrate and sidewalls of the first gate electrode, a second insulating film having therein a charge accumulator portion; (c) forming, over the second insulating film, a second gate electrode adjacent to the first gate electrode via the second insulating film; and (d) forming a metal silicide film over the upper surface of the first gate electrode, wherein in the step (c), the second gate electrode is formed with a height smaller than that of the first gate electrode, and in the step (d), the metal silicide film is not formed at the end portion and the nearby region thereof, on the side of the first gate electrode, of the surface of the second gate electrode not in contact with the second insulating film.

Advantages available by the typical inventions, of the inventions disclosed by the present application, will next be described briefly.

The present invention enables improvement in the production yield of a semiconductor device.

The present invention enables improvement in the performance of a semiconductor device.

BRIEF DESCRIPTION OF THE DRAWINGS

FIG. 4 is a table showing one example of application conditions of a voltage to each site of a selected memory cell at the time of "program", "erase" and "read";

DETAILED DESCRIPTION OF THE PREFERRED EMBODIMENTS

Figure 1:
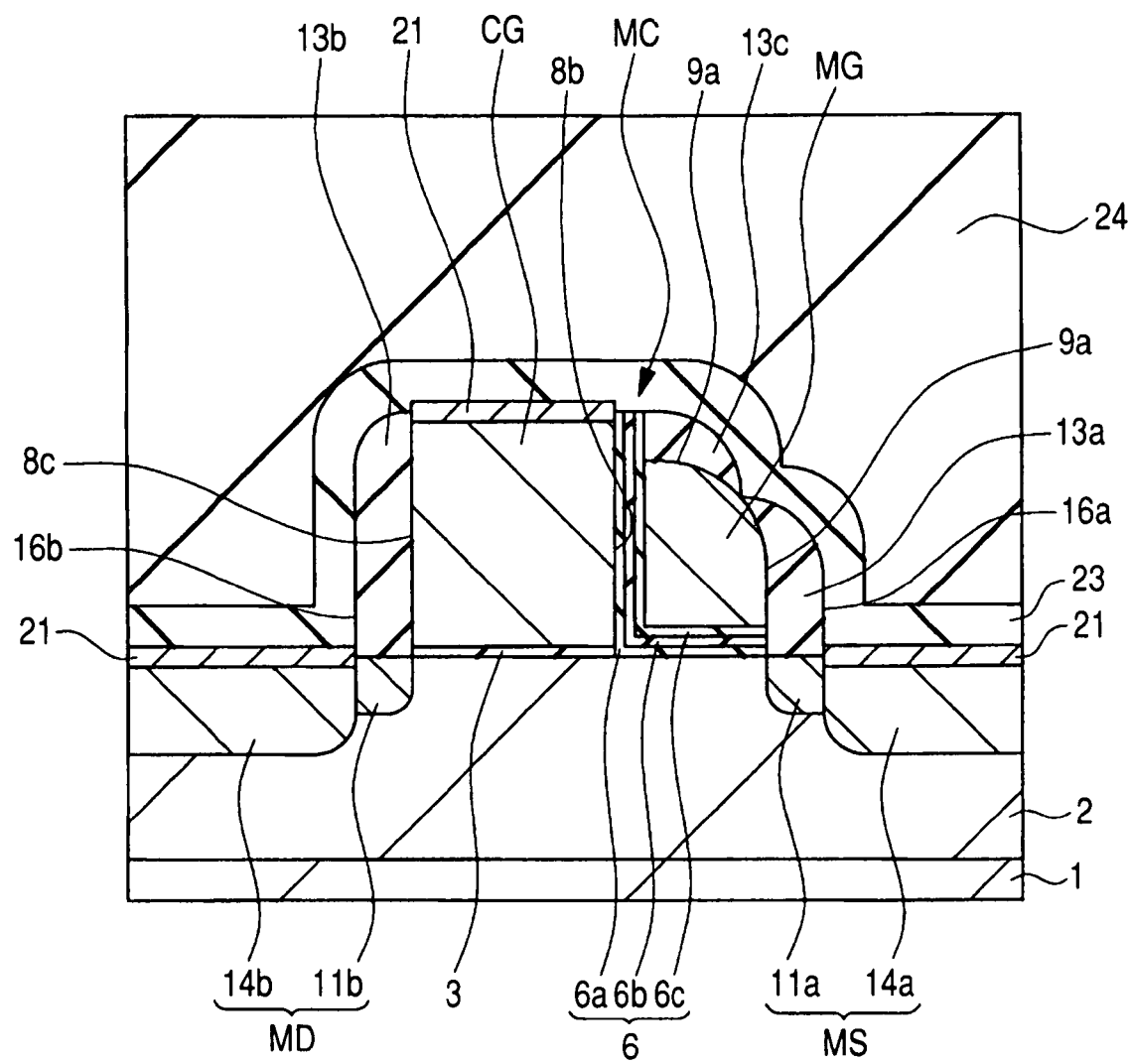
FIG. 1 is a fragmentary cross-sectional view of a semiconductor device according to one embodiment of the present invention.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be greater than or less than the specific number unless otherwise specifically indicated or principally apparent that the number is limited to the specific number. Moreover in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or obviously different in principle. This also applies to the above-described value and range.

The present invention will next be described specifically based on accompanying drawings. In all the drawings for describing the below-described embodiments, members having like function will be identified by like reference numerals and overlapping descriptions will be omitted. In the below-described embodiments, portions which are the same or similar are not described in repetition unless otherwise particularly necessary.

In the drawings used in these embodiments, hatching is sometimes omitted even from a cross-sectional view to facilitate understanding of the drawing. Also even a plan view is sometimes hatched to facilitate understanding of the drawing.

Embodiment 1

The present invention mainly relates to a semiconductor device using a charge trap insulating film (an insulating film capable of accumulating charges therein) for a charge accumulator portion thereof so that in the below-described embodiment, a description will be made based on a memory cell having an n channel MISFET (MISFET: Metal Insulator Semiconductor Field Effect Transistor) as a basic structure and using a charge trap insulating film. In the below-described embodiment, the polarity (polarity of an applied voltage or polarity of the carrier during the program, erase and read operations) is for describing the operation of the memory cell having an n channel MISFET as a basic structure. When a memory cell has a p channel MISFET as a basic structure, similar operation is available in principle by reversing all the polarities of the applied voltage and conductivity type of the carrier.

A semiconductor device according to this Embodiment and a manufacturing method of the device will next be described referring to some drawings.

Figure 2:
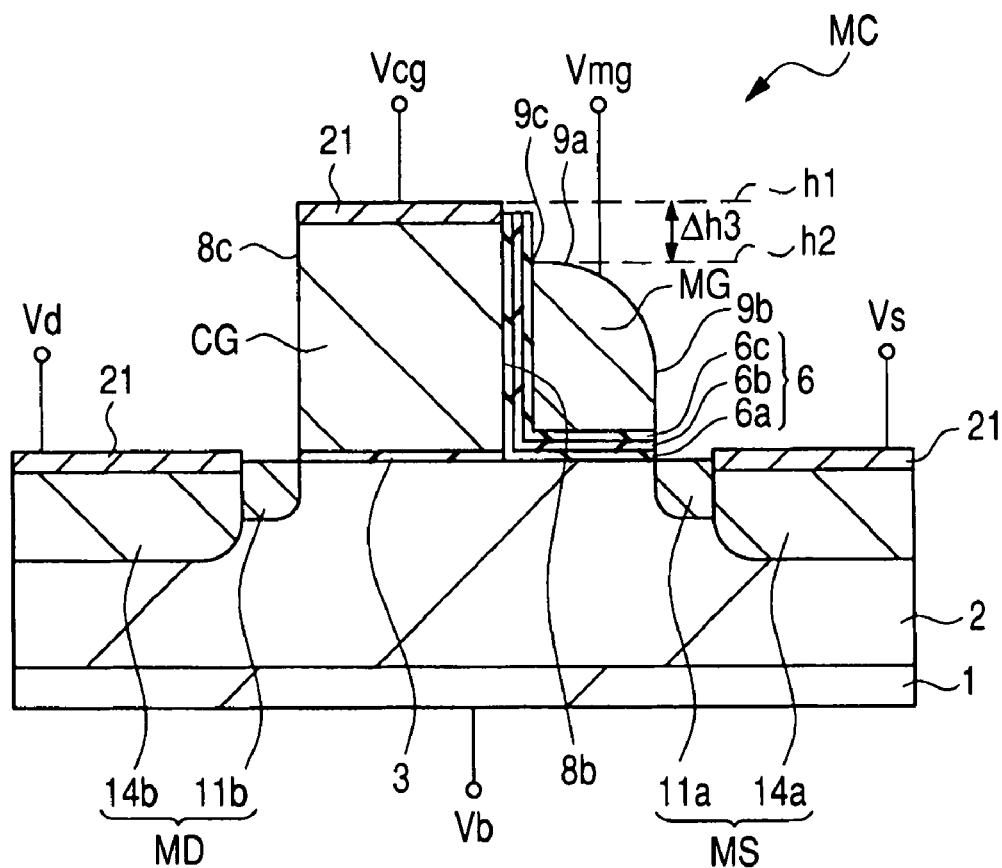
FIG. 2 is a fragmentary cross-sectional view of the semiconductor device according to the one embodiment of the present invention.
Figure 3:
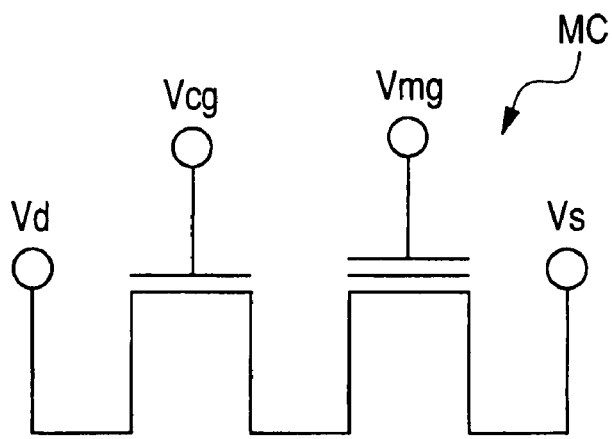
FIG. 3 is an equivalent circuit diagram of a memory cell.

FIG. 1 is a fragmentary cross-sectional view of a semiconductor device according to this Embodiment. The semiconductor device according to this Embodiment is a semiconductor device (nonvolatile semiconductor memory device) equipped with a nonvolatile memory (nonvolatile memory element, flash memory, nonvolatile semiconductor memory device) and a fragmentary cross-sectional view of the memory cell region of the nonvolatile memory is illustrated in FIG. 1. FIG. 2 is a fragmentary cross-sectional view illustrating the schematic cross-section structure of a memory cell MC of the semiconductor device according to this Embodiment, while FIG. 3 is an equivalent circuit diagram of the memory cell MC. Of the structure illustrated in FIG. 1, only p well 2, insulating films 3 and 6, control gate electrode CG, memory gate electrode MG and semiconductor regions MS and MD are illustrated and sidewall insulating films 13a, 13b, and 13c and insulating films 23 and 24 are omitted in FIG. 2. To facilitate understanding, voltages Vd, Vcg, Vmg, Vs, and Vb to be applied to respective sites are schematically illustrated in FIG. 2.

The nonvolatile memory illustrated in FIGS. 1 to 3 is a split gate memory cell using an MONOS film.

As illustrated in FIGS. 1 and 2, element isolation regions (not illustrated) for isolating elements are formed in a semiconductor substrate (semiconductor wafer) 1 made of, for example, p-type single crystal silicon having a specific resistance of from about 1 to 10 Ωcm. The p well 2 is formed in the active regions isolated by these element isolation regions. A memory cell MC of a nonvolatile memory composed of a memory transistor and a control transistor (select transistor) as illustrated in FIGS. 1 and 2 is formed over the p well 2 of the memory cell region. A plurality of the memory cells MC are formed in the individual memory cell regions in array form. The memory cell regions are electrically isolated from the other region by the element isolation regions.

The memory cell MC of the nonvolatile memory is a split gate cell using an MONOS film.

As illustrated in FIGS. 1 and 2, the memory cell MC of the nonvolatile memory is equipped with n type semiconductor regions MS and MD for source and drain formed in the p well 2 of the semiconductor substrate 1, memory gate electrode MG and control gate electrode (select gate electrode) CG formed over the semiconductor substrate 1 (p well 2), an insulating film 3 formed between the control gate electrode CG and semiconductor substrate 1 (p well 2), and an insulating film 6 formed between the memory gate electrode MG and semiconductor substrate 1 (p well 2) and between the memory gate electrode MG and control gate electrode CG.

The control gate electrode CG and memory gate electrode MG constituting the nonvolatile memory extend along the main surface of the semiconductor substrate 1 and juxtaposed to each other while having the insulating film 6 between their side surfaces opposed to each other. The control gate electrode CG and memory gate electrode MG of the memory cell MC are formed over the semiconductor substrate 1 (p well 2) over and between the semiconductor region MD and the semiconductor regions MS via the insulating films 3 and 6. The memory gate electrode MG is located on the side of the semiconductor region MS, while the control gate electrode CG is located on the side of the semiconductor region MD. The control gate electrode CG and memory gate electrode MG are adjacent to each other with the insulating film 6 therebetween and the memory gate electrode MG is formed over the sidewall of the control gate electrode CG like a sidewall spacer via the insulating film 6. The insulating film 6 extends both in a region between the memory gate electrode MG and semiconductor substrate 1 (p well 2) and in a region between the memory gate electrode MG and control gate electrode CG.

The insulating film 3 (that is, the insulating film 3 below the control gate electrode CG) formed between the control gate electrode CG and semiconductor substrate 1 (p well 2) functions as a gate insulating film of a control transistor (select transistor). The insulating film 6 (that is, the insulating-film 6 below the memory gate electrode MG) between the memory gate electrode MG and the semiconductor substrate 1 (p well 2) functions as a gate insulating film (gate insulating film having a charge accumulator portion therein) of the memory transistor.

The insulating film 6 is an insulating film (ONO film) composed of a film stack of a silicon nitride film 6b (that is, charge accumulator portion) for accumulating charges and silicon oxide films 6a and 6c located above and below the silicon nitride film 6b. In other words, the insulating film 6 is composed of an ONO (oxide-nitride-oxide) film having the silicon oxide film 6a, silicon nitride film 6b and silicon oxide film 6c stacked one after another in the order from the side of the memory gate electrode MG. The silicon nitride film 6b is a trap insulating film formed in the insulating film 6 and it functions as a charge accumulator film (charge accumulator portion) for accumulating therein charges so that the insulating film 6 can be regarded as an insulating film having, inside thereof, a charge accumulator portion.

In this embodiment, the MISFET made of the memory gate electrode MG is called a memory transistor and the MISFET made of the control gate electrode CG is called a control transistor (or select transistor).

The semiconductor region MS is a semiconductor region which functions as one of source region and drain region, while the semiconductor region MD is a region which functions as the other one of the source region and drain region. In this Embodiment, the semiconductor region MS is a semiconductor region functioning as a source region, while the semiconductor region MD is a semiconductor region functioning as a drain region. The semiconductor regions MS and MD are made of a semiconductor region (n type impurity diffusion layer) having an n type impurity introduced therein and they have each an LDD (lightly doped drain) structure. Described specifically, the semiconductor region MS for source has an n⁻ type semiconductor region 11a and an n⁺ type semiconductor region 14a having a higher impurity concentration than the n⁻ type semiconductor region 11a, while the semiconductor region MD for drain has an n⁻ type semiconductor region 11b and an n⁺ type semiconductor region 14b having a higher impurity concentration than the n⁻ type semiconductor region 11b.

Over the sidewalls of the memory gate electrode MG and control gate electrode CG (sidewalls on the sides not adjacent to each other), sidewall insulating films (sidewalls, sidewall spacers) 13a and 13b made of an insulator (silicon oxide film, insulating film) such as silicon oxide are formed. In other words, the sidewall insulating film 13a is formed over a sidewall (side surface) 9b of the memory gate electrode MG on the side opposite to the side adjacent to the control gate electrode CG via the insulating film 6, while the sidewall insulating film 13b is formed over the sidewall (side surface) 8c of the control gate electrode CG on the side opposite to the side adjacent to the memory gate electrode MG via the insulating film 6.

The n⁻ type semiconductor region 11a of the source portion is formed in self alignment with the sidewall 9b of the memory gate electrode MG, while the n⁺ type semiconductor region 14a is formed in self alignment with the side surface (side surface on the side opposite to the side adjacent to the memory gate electrode MG) 16a of the sidewall insulating film 13a over the sidewall 9b of the memory gate electrode MG. The lightly-doped n⁻ type semiconductor region 11a is therefore formed below the sidewall insulating film 13a over the sidewall of the memory gate electrode MG, while the heavily-doped n⁺ type semiconductor region 14a is formed outside the lightly-doped n⁻ type semiconductor region 11a. Accordingly, the lightly-doped n⁻ type semiconductor region 11a is formed so as to come into contact with the channel region of the memory transistor, while the heavily-doped n⁺ type semiconductor region 14a is formed so as to come into contact with the lightly-doped n⁻ type semiconductor region 11a and be spaced from the channel region of the memory transistor by the width of the n⁻ type semiconductor region 11a.

The n⁻ type semiconductor region 11b of the drain portion is formed in self alignment with the sidewall 8c of the control gate electrode CG, while the n⁺ type semiconductor region 14b is formed in self alignment with a side surface (side surface on the side opposite to the side adjacent to the control gate electrode CG) 16b of the sidewall insulating film 13b over the sidewall 8c of the control gate electrode CG. The lightly-doped n⁻ type semiconductor region 11b is therefore formed below the sidewall insulating film 13b over the sidewall of the control gate electrode CG, while the heavily-doped n⁺ type semiconductor region 14b is formed outside the lightly-doped n⁻ type semiconductor region 11b. Accordingly, the lightly-doped n⁻ type semiconductor region 11b is formed so as to come into contact with the channel region of the control transistor, while the highly-doped n⁺ type semiconductor region 14b is formed so as to come into contact with the lightly-doped n⁻ type semiconductor region 11b and be spaced from the channel region of the control transistor by the width of the n⁻ type semiconductor region 11b.

A channel region of the memory transistor is formed below the insulating film 6 below the memory gate electrode MG, while a channel region of the select transistor is formed below the insulating film 3 below the control gate electrode CG. In the channel formation region of the control transistor below the insulating film 3 below the control gate electrode CG, a semiconductor region (p type semiconductor region) for controlling the threshold value of the control transistor is formed as needed, while in the channel formation region of the memory transistor below the insulating film 6 below the memory gate electrode MG, a semiconductor region (p type semiconductor region or n type semiconductor region) for controlling the threshold value of the memory transistor is formed as needed.

The memory gate electrode MG and control gate electrode CG are each made of a silicon film (conductor film) such as n type polysilicon (polycrystalline silicon doped with an impurity or doped polysilicon). The control gate electrode CG is formed by patterning a polycrystalline silicon film (polycrystalline silicon film having an n type impurity introduced or doped therein) formed over the semiconductor substrate 1. The memory gate electrode MG is formed by anisotropically etching a polycrystalline silicon film (polycrystalline silicon film having an n type impurity introduced or doped therein) formed over the semiconductor substrate 1 to cover the control gate electrode CG and then leaving the polycrystalline silicon film over the sidewall of the control gate electrode CG via the insulating film 6.

A metal silicide film (metal silicide layer) 21 (for example, cobalt silicide film) is formed over the upper portion (upper surface) of the control gate electrode CG and over the upper surfaces (surfaces) of the n⁺ type semiconductor regions 14a and 14b by a silicide process or the like. No metal silicide film is, on the other hand, formed over the upper surface of the memory gate electrode MG. This metal silicide film 21 enables reduction in the diffusion resistance or contact resistance.

Insulating films 23 and 24 are formed over the semiconductor substrate 1 to cover the control gate electrode CG and memory gate electrode MG. The insulating film (silicon nitride film) 23 is thinner than the insulating film 24 and it is made of, for example, a silicon nitride film. The insulating film (silicon oxide film) 24 is thicker than the insulating film 23 and is made of, for example, a silicon oxide film. As will be described later, a contact hole 25 is formed in the insulating films 23 and 24 and a plug 26 is buried in the contact hole 25. An interconnect 27 and the like are formed over the insulating film 24 having the plug 26 buried therein, which is not illustrated in FIG. 1. The insulating film 24 functions as an interlayer insulating film and the insulating, film 23 can function as an etching stopper film when the contact hole 25 is formed in the insulating film 24.

The characteristics of the structure of the semiconductor device according to this Embodiment will next be described more specifically.

As illustrated in FIGS. 1 and 2, the metal silicide film 21 is formed over the upper portion (upper surface) of the control gate electrode CG and over the upper surfaces (surfaces) of the n⁺ type semiconductor regions 14a and 14b by the silicide process or the like, but no metal silicide film is formed over the upper surface of the memory gate electrode MG.

Described specifically, the semiconductor device according to this Embodiment has a structure in which no metal silicide film is formed at least the end portion (that is, the end portion adjacent to the control gate electrode CG via the insulating film 6, which portion corresponds to the end portion 9C illustrated in FIG. 2) or nearby region thereof, on the side of the control gate electrode CG, of the surfaces (upper surface 9a and sidewall 9b) of the memory gate electrode MG which are not in contact with the insulating film 6. It is preferred that no metal silicide film is formed over the upper surface 9a of the memory gate electrode MG.

In this Embodiment, the height $h_2$ of the memory gate electrode MG is lower than the height $h_1$ of the control gate electrode CG ($h_1 > h_2$). There is therefore a step difference (step difference portion) between the upper surface of the control gate electrode CG and the upper surface 9a of the memory gate electrode MG. Since the height $h_2$ of the memory gate electrode MG is lower than the height $h_1$ of the control gate electrode CG, the memory gate electrode MG is not formed over the upper region of the sidewall 8b of the control gate electrode CG adjacent to the memory gate electrode MG (via the insulating film 6), but a sidewall insulating film 13c (silicon oxide film) is formed over the upper region of the sidewall 8b of the control gate electrode CG and at the same time over upper portion (over the supper surface 9a) of the memory gate electrode MG.

The sidewall insulating films 13a and 13b are also formed over the sidewalls 9b and 8c, respectively, on the side where the memory gate electrode and control gate electrode do not face each other. The sidewall insulating film 13c over the upper portion of the sidewall 8b of the control gate electrode CG is formed by the same step as that employed for the formation of the sidewall insulating film 13a over the sidewall 9b of the memory gate electrode MG and the sidewall insulating film 13b over the sidewall (sidewall on the side opposite to the sidewall 8b) 8c of the control gate electrode CG as will be described later. The sidewall insulating film 13c over the upper portion of the sidewall 8b of the control gate electrode CG, the sidewall insulating film 13b over the sidewall 9b of the memory gate electrode MG, and the sidewall insulating film 13b over the sidewall 8c of the control gate electrode CG are therefore made of the same material, preferably a silicon oxide film. A silicon oxide film (sidewall insulating film 13c) is therefore formed over the upper portion of the memory gate electrode MG. Since the insulating film 23 which is a silicon nitride film is formed to cover the control gate electrode CG and memory gate electrode MG over the main surface of the semiconductor substrate 1, the sidewall insulating film 13c (silicon oxide film) over the upper portion of the memory gate electrode MG is formed between the insulating film 23 (silicon nitride film) and the memory gate electrode MG. In FIG. 1, the sidewall insulating film 13c is in contact with the upper surface 9a of the memory gate electrode MG and has the insulating film 6 between the sidewall insulating film 13c and the control gate electrode CG. The sidewall insulating film 13c is made of an insulator so that the insulating film 6 may be interposed between the sidewall insulating film 13c and control gate electrode CG or the sidewall insulating film 13c may be in direct contact with the control gate electrode CG without insulating film 6 therebetween.

Since the height $h_2$ of the memory gate electrode MG is made smaller than the height $h_1$ of the control gate electrode CG and the sidewall insulating film 13c (silicon oxide film) is formed over the sidewall 8b (the upper portion thereof) of the control gate electrode CG and at the same time over the upper portion (over the upper surface 9a) of the memory gate electrode MG, this sidewall insulating film 13c prevents silicidation of the upper surface 9a of the memory gate electrode MG in the silicidation step. The formation of a metal silicide film is prevented at the end portion (corresponding to the end portion 9c illustrated in FIG. 2) or nearby region thereof, on the side of the control gate electrode CG, of the surfaces (upper surface 9a and sidewall 9b) of the memory gate electrode MG not in contact with the insulating film 6.

The above-described heights h1 and h2 are the heights in a direction perpendicular to the main surface of the semiconductor substrate 1 so that the height $h_1$ of the control gate electrode CG corresponds to the distance (height) from the main surface (surface of the p well 2) of the semiconductor substrate 1 to the upper surface of the metal silicide film 21 on the upper surface of the control gate electrode CG. The height $h_2$ of the memory gate electrode MG corresponds to the distance (height) from the main surface (surface of the p well 2) of the semiconductor substrate 1 to the uppermost portion (top portion) of the memory gate electrode MG.

A difference $\Delta h_3$ (wherein, $\Delta h_3 = h_1 - h_2$) between the height $h_1$ of the control gate electrode CG and the height $h_2$ of the memory gate electrode MG is preferably 10 nm or greater (this means $\Delta h_3 \geq 10$ nm), more preferably 20 nm or greater (this means $\Delta h_3 \geq 20$ nm). The sidewall insulating film 13 can be formed accurately when such a difference is ensured.

FIG. 4 is a table showing one example of application conditions of a voltage to each site of the selected memory cell during "program", "erase" and "read" operations. In the table of FIG. 4, described are a voltage Vd to be applied to a drain region (semiconductor region MD), a voltage Vcg to be applied to a control gate electrode CG, a voltage Vmg to be applied to a memory gate electrode MG, a voltage Vs to be applied to a source region (semiconductor region MS), and a base voltage Vb to be applied to a p well 2, each in a memory cell (selected memory cell) as illustrated in FIGS. 2 and 3. Only one example of the application conditions of a voltage is shown in the table of FIG. 4 so that it can be changed as needed without limiting thereto. In this Embodiment, injection of electrons into the silicon nitride film 6b which is a charge accumulator portion in the insulating film 6 of the memory transistor is defined as "programming" and the injection of holes is defined as "erasing".

As a programming system, hot electron programming which is so-called source-side injection system can be employed. For example, a voltage as shown in the column of "program" in FIG. 4 is applied to each site of the selected memory cell for programming and electrons are injected into the silicon nitride film 6 in the insulating film 6 of the selected memory cell. Hot electrons are generated in the channel region (between the source and drain) below and between two gate electrodes (memory gate electrode MG and control gate electrode CG) and injected locally into a region, on the side of the select transistor, of the silicon nitride film 6b which is a charge accumulator portion in the insulating film 6 below the memory gate electrode MG. The hot electrons (electrons) thus injected are captured in the trap of the silicon nitride film 6b in the insulating film 6, resulting in an increase in the threshold voltage of the memory transistor.

For erasing, a BTBT (Band-To-Band Tunneling) hot hole injection erase system can be employed. In this system, holes (positive holes) generated by the BTBT (Band-To-Band Tunneling) are injected into the charge accumulator portion (the silicon nitride film 6b in the insulating film 6) to perform erasing. For example, voltages as shown in the column of "erase" of FIG. 4 are applied to respective sites of a selected memory cell on which erasing is effected, and holes (positive holes) are generated by the BTBT (Band-To-Band Tunneling) phenomenon to cause field acceleration, thereby injecting the holes into the silicon nitride film 6b in the insulating film 6 of the selected memory cell, whereby the threshold voltage of the memory transistor is reduced.

During read operation, for example, voltages as shown in the column of "read" of FIG. 4 are applied to respective sites of a selected memory cell to be read. By setting the voltage Vmg to be applied to the memory gate electrode MG during read operation to a value between the threshold voltage of the memory transistor in a program state and the threshold voltage thereof in an erase state, the program state can be discriminated from the erase state.

A manufacturing method of the semiconductor device according to this Embodiment will next be described.

FIGS. 5 to 15 are fragmentary cross-sectional views of the semiconductor device of this Embodiment during its manufacturing steps. In each of FIGS. 5 to 15, a cross-sectional view of two memory cell regions having a source region in common.

Figure 5:
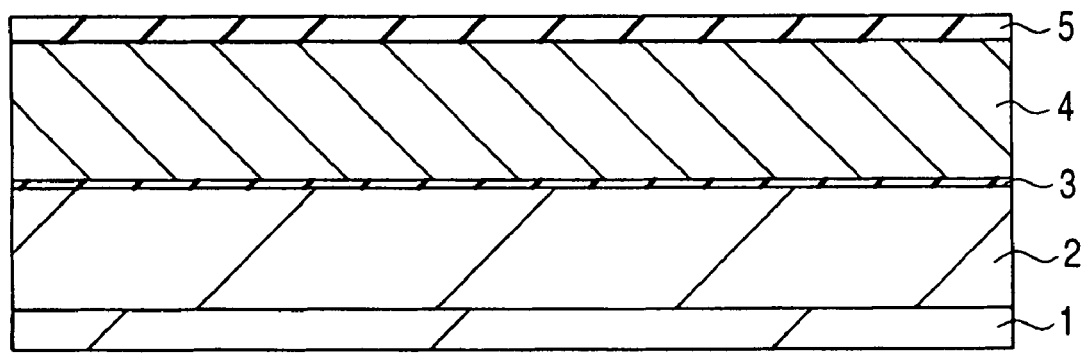
FIG. 5 is a fragmentary cross-sectional view of the semiconductor device according to the one embodiment of the present invention during a manufacturing step thereof.

As illustrated in FIG. 5, a semiconductor substrate (semiconductor wafer) 1 composed of p-type single crystal silicon having specific resistance of, for example, from about 1 to 10 Ωcm is prepared. Then, an element isolation region (not illustrated) is formed in the main surface of the semiconductor substrate 1 by an STI (Shallow Trench Isolation) method, LOCOS (Local Oxidization of Silicon) method or the like.

Next, a p well 2 is formed in the memory cell formation region (a region in which a memory cell of a nonvolatile memory is to be formed) of the semiconductor substrate 1. The p well 2 can be formed by the ion implantation of a p type impurity such as boron (B) into the semiconductor substrate 1. Ion implantation for adjusting the threshold value of a control transistor is then performed in the surface portion (surface layer portion) of the p well 2 if necessary. This makes it possible to control the impurity concentration of the channel region of the control transistor, thereby adjusting the threshold value of the control transistor to a desired value.

Next, the surface of the semiconductor substrate 1 (p well 2) is cleaned, followed by the formation of an insulating film 3 for a gate insulating film of the control transistor over the main surface (surface of the p well 2) of the semiconductor substrate 1. The insulating film 3 is made of, for example, a thin silicon oxide film and can be formed, for example, by the thermal oxidation method.

Over the main surface (over the insulating film 3) of the semiconductor substrate 1, a conductor film 4 for forming a control gate electrode CG is formed (deposited). The conductor film 4 is made of a silicon film such as polycrystalline silicon film (polycrystalline silicon film having an n type impurity doped therein or doped polysilicon film) and can be formed using CVD (Chemical Vapor Deposition) or the like method. The thickness (deposition thickness) of the conductor film 4 is adjusted to, for example about 250 nm.

An insulating film (protection film) 5 is then formed (deposited) over the conductor film 4. The insulating film 5 is made of a silicon oxide film and can be formed by CVD or the like method.

Figure 6:
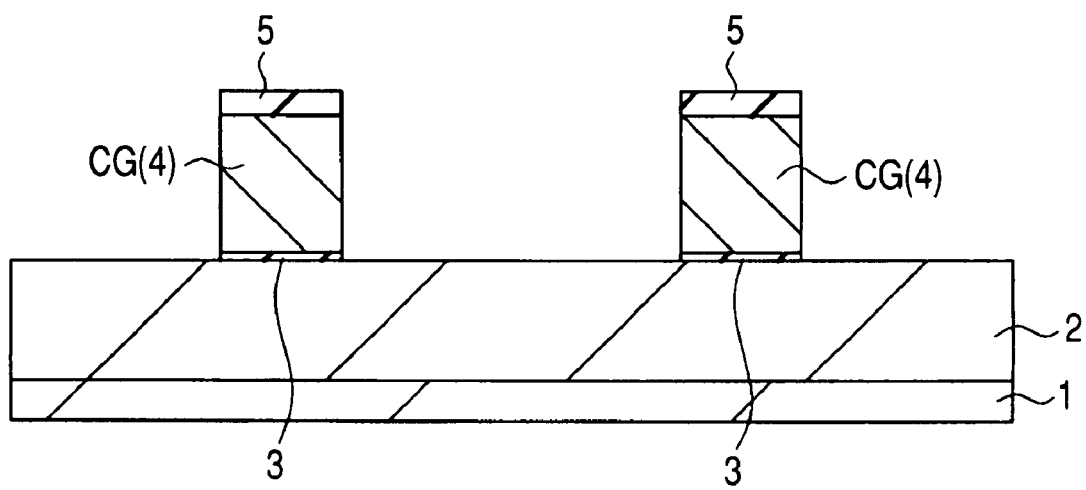
FIG. 6 is a fragmentary cross-sectional view of the semiconductor device during a manufacturing step thereof following that of FIG. 5.

As illustrated in FIG. 6, a film stack made of the conductor film 4 and the insulating film 5 is patterned (formed into pattern, processed, selectively removed) by using photolithography and dry etching. This patterning can be carried out using, for example, reactive ion etching (RIE). By the conductor film 4 thus patterned, the control gate electrode CG of the control transistor is formed. The control gate electrode CG extends in the depth direction and has a linear pattern. When the conductor film 4 and insulating film 5 are patterned, dry etching is preferably terminated when the surface of the insulating film 3 is exposed, whereby the surface of the semiconductor substrate 1 can be protected from an unnecessary damage.

Ion is then implanted into the surface portion (surface layer portion) of the p well 2 as needed in order to adjust the threshold value of the memory transistor. In this ion implantation, although an impurity ion is implanted into a region which will be the channel region of the memory transistor, no impurity ion is implanted into the region which will be the channel region of the memory transistor because of the presence of the insulating film 5 and control gate electrode CG. This makes it possible to adjust the impurity concentration in the channel region of the memory transistor, thereby controlling the threshold value of the memory transistor to a desired value.

The insulating film 3 which has left for protecting the surface of the semiconductor substrate 1 is removed, for example, by wet etching with hydrofluoric acid. By this removal, the insulating film 3 remains below the control gate electrode CG and the insulating film 3 of another region is removed. The insulating film 3 which has remained below the control gate electrode CG will be a gate insulating film of the control transistor.

Figure 7:
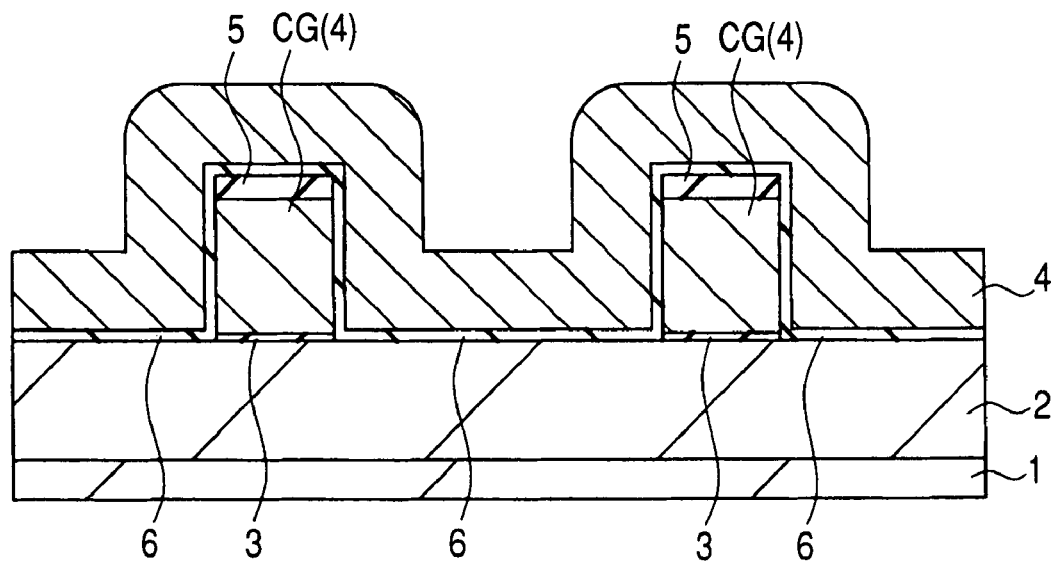
FIG. 7 is a fragmentary cross-sectional view of the semiconductor device during a manufacturing step thereof following that of FIG. 6.

As illustrated in FIG. 7, an insulating film 6 for the gate insulating film of the memory transistor is next formed. The insulating film 6 is, as described above, an insulating film having inside a charge accumulator portion and is made of a film stack (ONO film) of a silicon oxide film 6a, a silicon nitride film 6b and a silicon oxide film 6c. In this diagram, the insulating film 6 is illustrated as a single layer to simplify the illustration. The insulating film 6 is formed over the surface of the p well 2 and over the exposed surface (sidewall) of the control gate electrode CG.

The silicon oxide films of the insulating film 6 are formed, for example, by oxidation treatment (thermal oxidation treatment) or CVD (Chemical Vapor Deposition), or combination of them. The silicon nitride film can be formed, for example, by CVD. For example, after formation of a lower silicon oxide film (corresponding to the silicon oxide film 6a) of the insulating film 6 by thermal oxidation, a silicon nitride film (corresponding to the silicon nitride film 6b) of the insulating film 6 is deposited by CVD and then, an upper silicon oxide film (corresponding to the silicon oxide film 6c) of the insulating film 6 can be formed by CVD or thermal oxidation, or combination of them.

The insulating film 6 serves as a gate insulating film of a memory gate which will be formed later and has a function of retaining charges. Accordingly, the insulating film has a film stack structure of at least three layers. The potential barrier height of the inside layer (silicon nitride film 6b) is lower than that of the outside layers (silicon oxide films 6a and 6c). Such a structure can attained, for example, by constituting the insulating film 6 from a film stack of the silicon oxide film 6a, silicon nitride film 6b and silicon oxide film 6c as in this Embodiment.

A conductor film 7 for forming the memory gate electrode MG is formed (deposited) over the whole surface of the semiconductor substrate 1, that is, over the insulating film 6 so as to cover the control gate electrode CG. The conductor film 7 is made of a silicon film such as polycrystalline silicon film (polycrystalline silicon film doped with an n type impurity or doped polysilicon film) and can be formed, for example, by CVD. The thickness (deposition thickness) of the conductor film 7 can be adjusted to, for example, from about 50 to 100 nm.

Figure 8:
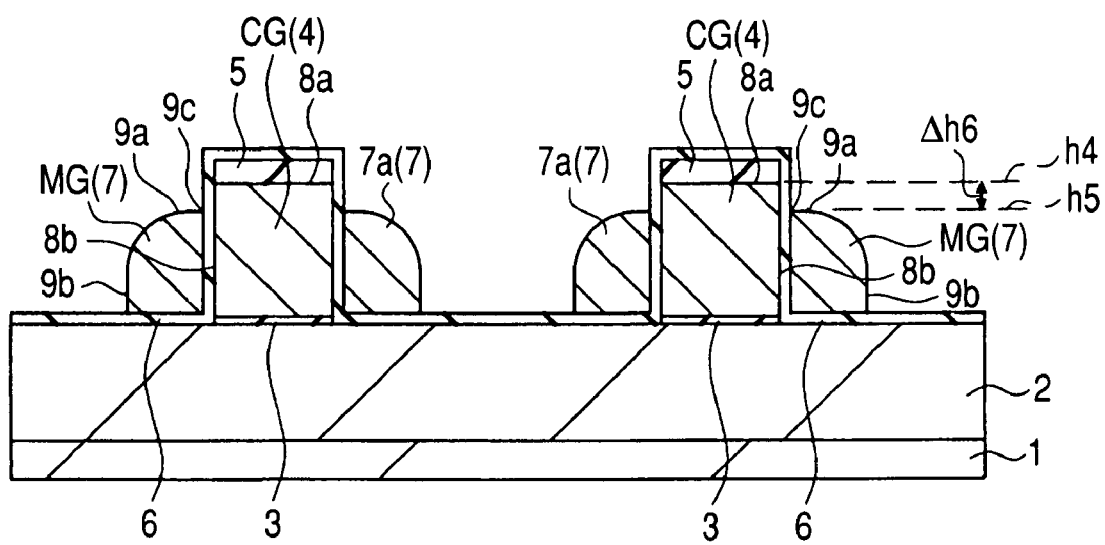
FIG. 8 is a fragmentary cross-sectional view of the semiconductor device during a manufacturing step thereof following that of FIG. 7.

As illustrated in FIG. 8, the conductor film 7 is etched back (etched, anisotropically etched) by anisotropic etching technology to expose the upper surface of the insulating film 6, whereby the conductor film 7 is left (via the insulating film 6) on both sidewalls of the control gate electrode CG and the conductor film 7 is removed from the other region. In the etchback (etching) step of the conductor film 7, dry etching with a mixed gas such as $Cl_2$, $O_2$ and $CF_4$ can be employed.

By this etching, the conductor film 7 has remained via the insulating film 6 over the sidewalls (side surfaces) of the control gate electrode CG and the conductor film 7 is removed from another region, whereby the memory gate electrode MG and a polycrystalline silicon spacer 7a, each made of the remaining conductor film 7, are formed. At this time, the conductor film (polycrystalline silicon film) 7 remaining over one of the sidewalls (sidewalls opposed to each other with the control gate electrode therebetween) of the control gate electrode CG via the insulating film 6 becomes the memory gate electrode MG, while the conductor film (polycrystalline silicon film) 7 remaining over the other sidewall via the insulating film 6 becomes the polycrystalline silicon spacer 7a.

In such a manner, the memory gate electrode MG and polycrystalline silicon spacer 7a can be formed in a similar manner to that employed for the formation of the sidewalls (sidewall-spacers, sidewall insulating films) of an insulating film over side surfaces of a gate electrode. The memory gate electrode MG and polycrystalline silicon spacer 7a are formed over the sidewalls which are opposite to each other with the control gate electrode CG therebetween and they have a symmetrical structure. The insulating film 6 below the memory gate electrode MG will be a gate insulating film of the memory transistor. In such a manner, the control gate electrode CG and the memory gate electrode MG adjacent thereto via the insulating film 6 are formed.

In this Embodiment, during the etchback (etching, anisotropic etching) of the conductor film 7, the upper surfaces (uppermost portions, top portions, portions which exist at the highest position) of the polycrystalline silicon spacer 7a (the conductor film 7 forming the polycrystalline silicon spacer) and the memory gate electrode MG (the conductor film 7 forming the memory gate electrode) are adjusted to be lower than the upper surface of the control gate electrode CG (conductor film 4 forming the control gate electrode) by controlling the etching time, thereby anisotropically etching the conductor film 7 more than the deposition thickness of the conductor film 7. Described specifically, etchback (etching) of the conductor film 7 is performed until the height $h_5$ of the memory gate electrode MG (and polycrystalline silicon spacer 7a) corresponding to the height of the remaining conductor film 7 becomes lower than the height $h_4$ of the control gate electrode CG (the conductor film 4 forming the control gate electrode CG) (meaning that until the $h_4$ and $h_5$ satisfy the following equation $h_4 > h_5$). After the etchback of the conductor film 7, the height $h_5$ of the memory gate electrode MG (the conductor film 7 forming the memory gate electrode MG) becomes lower than the height $h_4$ of the control gate electrode CG (the conductor film 4 forming the control gate electrode) (meaning $h_4 > h_5$).

In this Embodiment, as described above, the conductor film 7 is etched back until the height (corresponding to the height $h_5$ of the memory gate electrode MG) of the conductor film 7 which has remained over the side wall of the control gate electrode CG via the insulating film 6 becomes lower than the height $h_4$ of the control gate electrode CG, whereby the memory gate electrode MG having a height $h_5$ lower than the height $h_4$ of the control gate electrode CG is formed.

These heights $h_4$ and $h_5$ are heights in a direction perpendicular to the main surface of the semiconductor substrate 1. The height $h_4$ of the control gate electrode CG (the conductor film 4 forming the control gate electrode) corresponds to the distance (height) from the main surface of the semiconductor substrate 1 (surface of the p well 2) to the upper surface of the control gate electrode CG (the conductor film 4 forming the control gate electrode). The height $h_5$ of the memory gate electrode MG (and polycrystalline silicon spacer 7a) which is the height of the remaining conductor film 7 corresponds to the distance (height) from the main surface of the semiconductor substrate 1 (surface of the p well 2) to the uppermost portion (top portion) of the memory gate electrode MG (and polycrystalline silicon spacer 7a) made of the remaining conductor film 7. The height of the polycrystalline silicon spacer 7a is substantially equal to the height of the memory gate electrode MG.

In the memory gate electrode MG, its upper surface 9a and sidewall (side surfaces) 9b are exposed, while other surfaces (side surface on the opposite side of the sidewall 9b and lower surface) are contiguous to the insulating film 6. The memory gate electrode MG is formed like a sidewall spacer so that the end portion 9c, on the side of the control gate electrode CG, of the upper surface 9a of the memory gate electrode MG exists at the highest position and the height of the memory gate electrode gradually lowers with distance from the end portion 9c. The height $h_5$ of the memory gate electrode MG is almost defined by the end portion 9c, on the side of the control gate electrode CG, of the upper surface 9a of the memory gate electrode MG.

A difference $\Delta h_6$ between the height $h_4$ of the control gate electrode CG (conductor film 4 forming the control gate electrode) and the height $h_5$ of the memory gate electrode MG (conductor film 7 forming the memory gate electrode) (that is, $\Delta h_6 = h_4 - h_5$) is 10 nm or greater (meaning that $\Delta h_6 \geq 10$ nm), more preferably 20 nm ($\Delta h_6 \geq 20$ nm. Between the upper surface 8a of the control gate electrode CG and the upper surface 9a of the memory gate electrode MG, a step difference (step difference portion) of preferably 10 nm or greater, more preferably 20 nm or greater is thus formed, making it possible to form a sidewall insulating film 13c more accurately as will be described later.

Over the lower region of the sidewall 8b of the control gate electrode CG on the formation side of the memory gate electrode MG, the memory gate electrode MG is formed via the insulating film 6, but the memory gate electrode MG is not formed over the upper region of the sidewall 8b.

Figure 9:
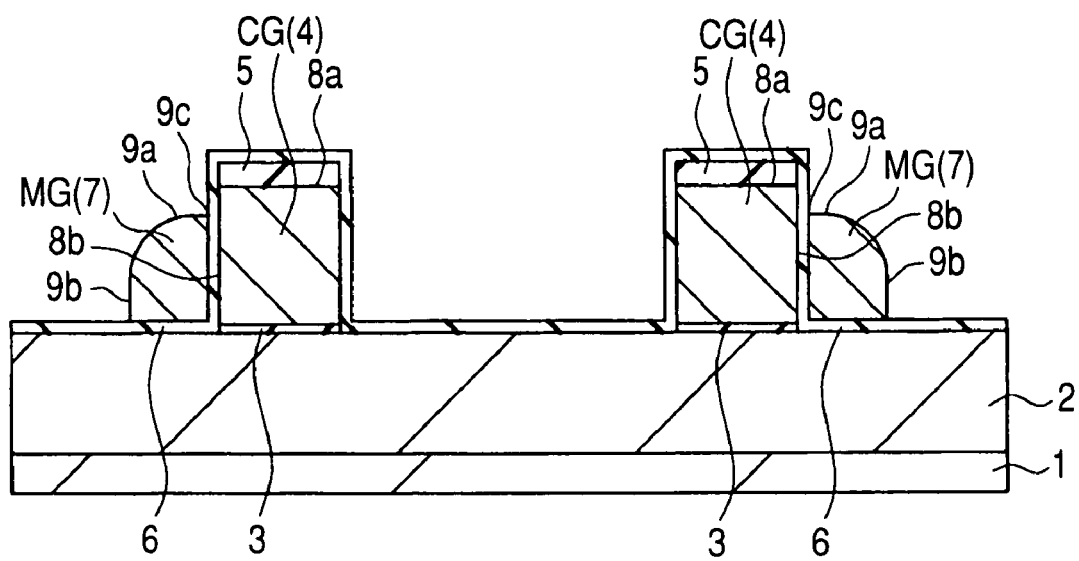
FIG. 9 is a fragmentary cross-sectional view of the semiconductor device during a manufacturing step thereof following that of FIG. 8.

A photoresist pattern (not illustrated) for covering the memory gate electrode MG and exposing the polycrystalline silicon spacer 7a is formed over the semiconductor substrate 1 by photolithography. By dry etching with the photoresist pattern as an etching mask, the polycrystalline silicon spacer 7a is removed. As illustrated in FIG. 9, the polycrystalline silicon spacer 7a is removed by this etching, but the memory gate electrode MG covered with the photoresist pattern remains without being etched.

Figure 10:
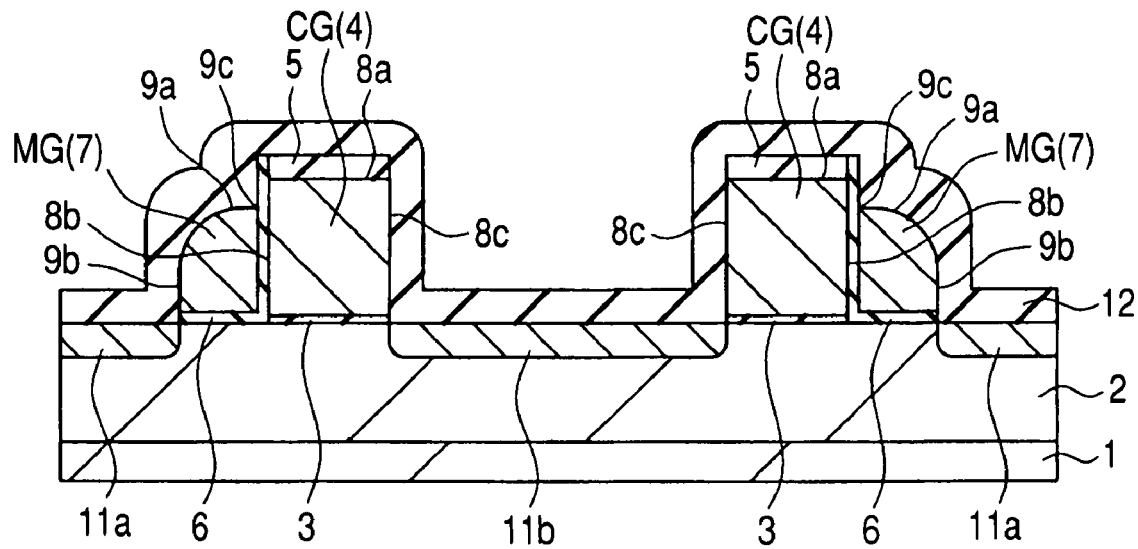
FIG. 10 is a fragmentary cross-sectional view of the semiconductor device during a manufacturing step thereof following that of FIG. 9.

As illustrated in FIG. 10, an upper silicon oxide film (the silicon oxide film formed from the same layer as the silicon oxide film 6c) and an underlying silicon nitride film (the silicon nitride film formed from the same layer as the silicon nitride film 6b) which are exposed portions of the insulating film 6 are removed using, for example, hydrofluoric acid and hot phosphoric acid.

Next, an n type impurity is ion-implanted at a low concentration in regions on both sides of the control gate electrode CG and memory gate electrode MG in the p well 2 to form an $n^-$ type semiconductor region 11a and an $n^-$ type semiconductor region 11b in the source portion and drain portion, respectively. In this ion implantation step, an impurity is not implanted into regions below the control gate electrode CG and memory gate electrode MG but implanted into regions on both sides thereof, whereby the n⁻ type semiconductor regions 11a and 11b are formed therein. Accordingly, the n⁻ type semiconductor region 11a is formed in alignment (self alignment) with the sidewall 9b of the memory gate electrode MG and the n⁻ type semiconductor region 11b is formed in alignment (self alignment) with the sidewall 8c of the control gate electrode CG. The n⁻ type semiconductor region 11a and n⁻ type semiconductor region 11b may be formed by the same ion implantation step or alternatively, by respective ion implantation steps with injection-blocking photoresist films formed by photolithography.

The lower silicon oxide film (the silicon oxide film formed from the same layer as the silicon oxide film 6a) which is an exposed portion of the insulating film 6 is removed using, for example, hydrofluoric acid. By this removal, the insulating film 6 remains between the memory gate electrode MG and semiconductor substrate 1 (p well 2) and between the memory gate electrode MG and control, gate electrode CG, but the insulating film 6 is removed from the other region.

An insulating film 12 is then formed (deposited) all over the main surface of the semiconductor substrate 1 to cover the control gate electrode CG and memory gate electrode MG. The insulating film 12 is an insulating film for forming the sidewall insulating films 13a, 13b and 13c and is preferably made of a silicon oxide film. It can be formed, for example, by CVD. The deposition thickness of the insulating film 12 can be adjusted to, for example, from 50 to 150 nm.

Figure 11:
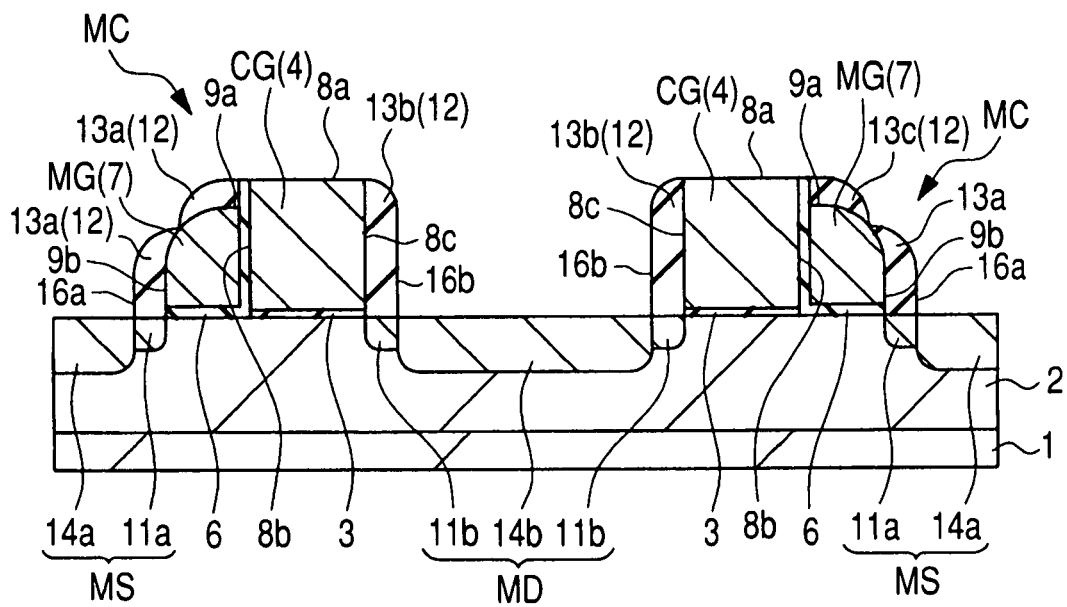
FIG. 11 is a fragmentary cross-sectional view of the semiconductor device during a manufacturing step thereof following that of FIG. 10.

As illustrated in FIG. 11, the insulating film 12 is etched back (etched, anisotropically etched) by anisotropic etching to leave the insulating film 12 over the sidewall of the control gate electrode CG and sidewall (side surface) of the memory gate electrode MG and remove the insulating film 12 from the other region. The sidewall insulating film 13a is made of the insulating film 12 remaining over the sidewall (side surface) of the memory gate electrode MG, while the sidewall insulating film (sidewall spacer) 13b is made of the insulating film 12 remaining on the sidewall (side surface) 8c of the control gate electrode CG. The sidewalls 9b and 8c of the memory gate electrode MG and the control gate electrode CG over which the sidewall insulating films 13a and 13b are formed are sidewalls on the opposite side of the sidewalls which face each other (adjacent to each other) with the insulating film 6 therebetween. As described above, the height $h_5$ of the memory gate electrode MG is lower than the height $h_4$ of the control gate electrode CG and a step difference is formed between the upper surface 8a of the control gate electrode CG and the upper surface 9a of the memory gate electrode MG so that in the etchback step of the insulating film 12, the insulating film 12 remains as the sidewall insulating film 13c over the upper region of the sidewall 8b of the control gate electrode CG and at the same time, over the upper portion (over the upper surface 9a) of the memory gate electrode MG. In the etchback step of the insulating film 12, the insulating film 5 over the control gate electrode CG is removed and the upper surface 8a of the control gate electrode CG is exposed.

In such a manner, sidewall insulating films 13a, 13b and 13c are formed over the upper portion (over the upper surface 9a) and the sidewall 9b of the memory gate electrode MG and over the sidewall 8c of the control gate electrode CG by leaving the insulating film 12 as sidewall insulating films over the upper portion (over the upper surface 9a) and the sidewall 9b of the memory gate electrode MG and over the sidewall 8c of the control gate electrode CG and removing the insulating film 12 from the other region.

When different from this Embodiment, there is no step difference between the upper surface 8a of the control gate electrode CG and the upper surface 9a of the memory gate electrode MG, and the height $h_4$ of the control gate electrode CG is equal to the height $h_5$ of the memory gate electrode MG (which means $h_4=h_5$), the sidewall insulating film 13 is formed over the sidewall 9b of the memory gate electrode MG, but the insulating film 12 does not remain over the upper portion of the memory gate electrode MG so that the memory gate electrode MG is exposed at an upper portion thereof.

In this Embodiment, on the other hand, the height $h_5$ of the memory gate electrode MG is made lower than the height $h_4$ of the control gate electrode CG (which means $h_4>h_5$) and a step difference is disposed between the upper surface 8a of the control gate electrode CG and the upper surface 9a of the memory gate electrode MG so that, as illustrated in FIG. 11, the insulating film 12 remains not only as the sidewall insulating film 13a over the sidewall 9b of the memory gate electrode MG but also as the sidewall insulating film 13c over the upper portion of the memory gate electrode MG. The memory gate electrode MG (conductor film 7 forming the memory gate electrode MG) therefore has the sidewall (side surface) 9b covered with the sidewall insulating film 13a and the upper portion (upper surface 9a) covered with the sidewall insulating film 13c. The surface of the memory gate electrode MG is covered with the sidewall insulating films 13a and 13c and is hardly exposed. The insulating film 12 over the upper surface 8a of the control gate electrode CG is removed so that the upper surface 8a of the control gate electrode CG is exposed.

The sidewall insulating film 13c is contiguous to the upper surface 9a of the memory gate electrode MG and has the insulating film 6 between the sidewall insulating film 13c and control gate electrode CG. The sidewall insulating film 13c is however made of an insulator such as silicon oxide so that the sidewall insulating film 13c and control gate electrode CG may have the insulating film 6 therebetween or the sidewall insulating film 13c and control gate electrode CG may be in direct contact without the insulating film 6 therebetween. The latter structure in which the sidewall insulating film 13c and control gate electrode CG are in direct contact without the insulating film 6 therebetween can be adopted only when a portion of the insulating film 6 which gets out of the memory gate electrode MG is removed by various etching steps.

An n type impurity is ion-implanted at a high concentration into regions of the p well 2 on both sides of the control gate electrode CG, memory gate electrode MG and sidewall insulating films 13a and 13b, whereby n⁺ type semiconductor region 14a and n⁺ type semiconductor region 14b are formed in the source portion and drain portion, respectively. In this ion implantation step, with the sidewall insulating film 13b over the sidewall 8c of the control gate electrode CG and the sidewall insulating film 13a over the sidewall 9b of the memory gate electrode MG as ion injection blocking masks, the ion implantation into the semiconductor substrate 1 (p well 2) is performed. In this ion implantation step, therefore, no impurity is injected into the regions below the control gate electrode CG, memory gate electrode MG and sidewall insulating films 13a and 13b but an n type impurity is ion-implanted into regions on both sides thereof to form the n⁺ type semiconductor regions 14a and 14b. The n⁺ type semiconductor region 14a is therefore formed in alignment (self alignment) with the side surface (sidewall) 16a of the sidewall insulating film 13a over the sidewall 9b of the memory gate electrode MG, while the n⁺ type semiconductor region 14b is formed in alignment (self alignment) with the side surface (sidewall) 16b of the sidewall insulating film 13b over the sidewall 8c of the control gate electrode CG. These n⁺ type semiconductor region 14a and n⁺ type semiconductor region 14b may be formed in the same ion implantation step. Alternatively, with an injection blocking photoresist films formed by photolithography, they may be formed by respective ion implantation steps.

By the n⁻ type semiconductor region 11a and n⁺ type semiconductor region 14a having a higher impurity concentration than the n⁻ type semiconductor region 11a, an n type semiconductor region MS functioning as a source region of the memory transistor is formed, while by the n⁻ type semiconductor region 11b and the n⁺ type semiconductor region 14b having a higher impurity concentration than the n⁻ type semiconductor region 11b, an n type semiconductor region MD functioning as a drain region of the control transistor is formed.

Figure 12:
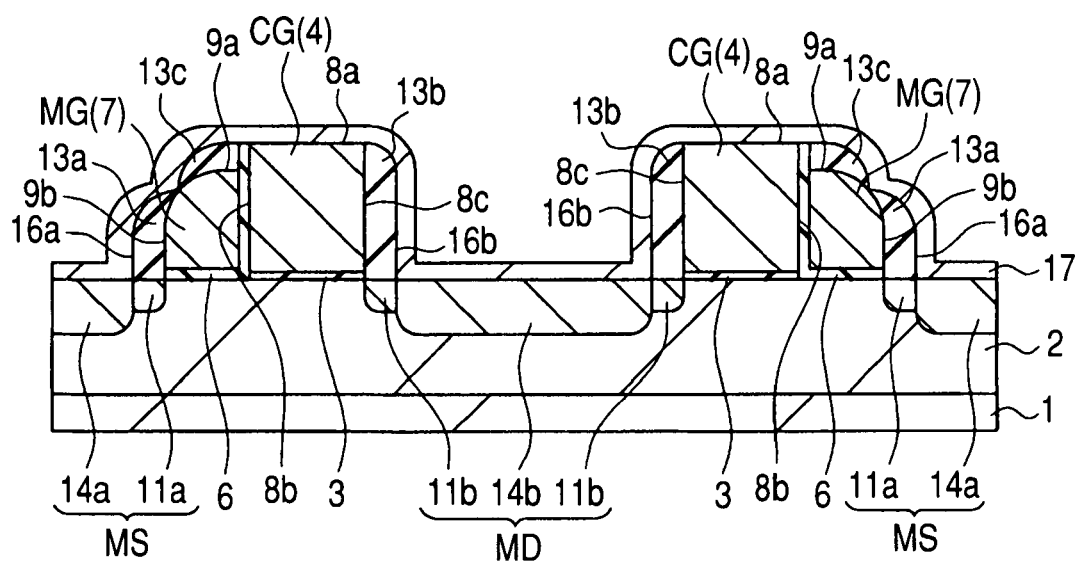
FIG. 12 is a fragmentary cross-sectional view of the semiconductor device during a manufacturing step thereof following that of FIG. 11.

After etching (for example, wet etching with dilute hydrofluoric acid) to expose the upper surfaces (surfaces) of the n⁺ type semiconductor regions 14a and 14b and control gate electrode CG as needed, a metal film 17 such as cobalt (Co) film is formed (deposited) all over the main surface of the semiconductor substrate 1 including the n⁺ type semiconductor regions 14a and 14b and the upper surface 8a of the control gate electrode CG so as to cover the control gate electrode CG, memory gate electrode MG and sidewall insulating films 13a, 13b and 13c, as illustrated in FIG. 12. The metal film 17 can be formed using, for example, sputtering.

As described above, the metal film 17 is formed while exposing the upper surface 8a of the control gate electrode CG (conductor film 4 forming the control gate electrode CG) so that the upper surface 8a of the control gate electrode CG (conductor film 4 forming the control gate electrode CG) is brought into contact with the metal film 17. The memory gate electrode MG (conductor film 7 forming the memory gate electrode MG) has the sidewall 9b covered with the sidewall insulating film 13a and the upper portion (upper surface 9a) covered with the sidewall insulating film 13c so that the sidewall 9b and upper portion (upper surface 9a) of the memory gate electrode MG (conductor film 7 forming the memory gate electrode MG) are not brought into contact with the metal film 17 and the memory gate electrode MG and metal film 17 have the sidewall insulating films 13a and 13c therebetween. In particular, the metal film 17 is not brought into contact with the end portion (a portion corresponding to the end portion 9c) and nearby region thereof, on the side of the control gate electrode CG, of the surface of the memory gate electrode MG not brought into contact with the insulating film 6 because of the presence of the side-wall insulating film 13c therebetween.

Figure 13:
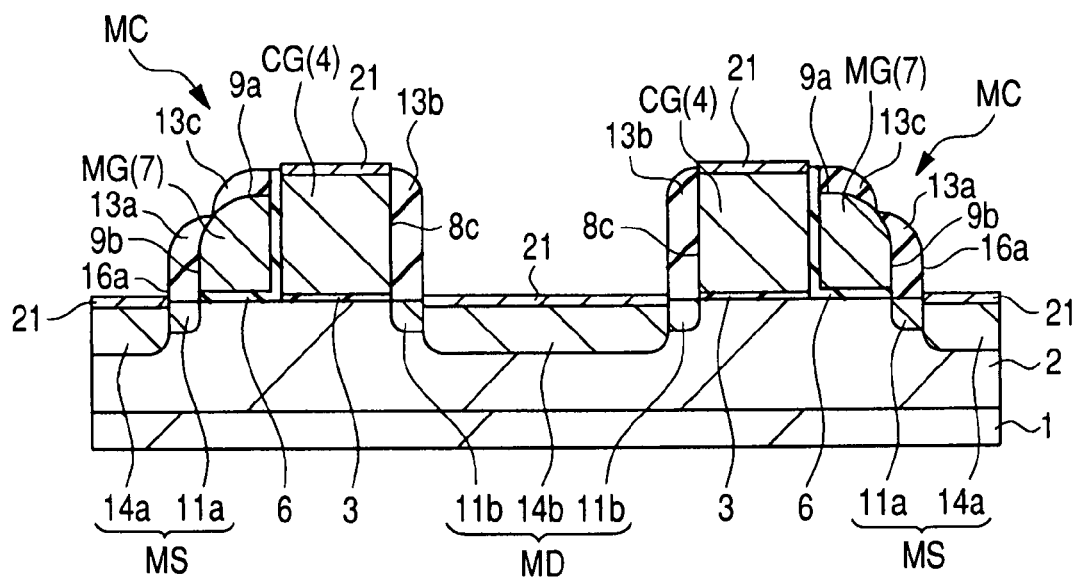
FIG. 13 is a fragmentary cross-sectional view of the semiconductor device during a manufacturing step thereof following that of FIG. 12.

As illustrated in FIG. 13, the semiconductor substrate 1 is heat treated to cause a reaction of the n⁺ type semiconductor regions 14a and 14b and the upper layer portion (surface layer portion) of the control gate electrode CG with the metal film 17, whereby a metal silicide film (metal silicide layer) 21 such as cobalt silicide film is formed over the upper portions (upper surfaces, surfaces, upper layer portions) of the n⁺ type semiconductor regions 14a and 14b and control gate electrode CG, respectively. Then, an unreacted portion of the metal film (cobalt film) 17 is removed. By the formation of the metal silicide film 21 lying over the n⁺ type semiconductor regions 14a and 14b and control gate electrode CG, the resistance of each of the source, drain and control gate electrode CG can be reduced.

The heat treatment is performed while bringing the upper surface 8a of the control gate electrode CG (conductor film 4 forming the control gate electrode) into contract with the metal film 17 as described above so that the upper layer portion of the control gate electrode CG (conductor film 4 forming the control gate electrode CG) reacts with the metal film 17 to form a metal silicide film 21 over the upper portion (upper surface) of the control gate electrode CG (conductor film 4 forming the control gate electrode CG). Since the side surface (sidewall 9b) and upper portion (upper surface 9a) of the memory gate electrode MG (conductor film 7 forming the memory gate electrode MG) are not contiguous to the metal film 17 and the sidewall insulating films 13a and 13c are interposed therebetween, these surfaces do not react with the metal film 17. The metal silicide film 21 is therefore not formed over the side surface (sidewall 9b) and upper portion (upper surface 9a) of the memory gate electrode MG (conductor film 7 forming the memory gate electrode MG).

In this Embodiment, the metal silicide film 21 is therefore formed over the upper portion (the upper surface) of the control gate electrode CG (conductor film 4 forming the control gate electrode CG), while no metal silicide film 21 is formed over the memory gate electrode MG (conductor film 7 forming the memory gate electrode MG). In particular, no metal silicide film 21 is formed at the end portion (portion corresponding to the end portion 9c) and nearby portion thereof, on the side of the control gate electrode CG, of the surface (upper surface 9a and sidewall 9b) of the memory gate electrode MG not in contact with the insulating film 6.

In the above-described manner, a structure as illustrated in FIG. 13 is obtained, whereby a memory cell of the nonvolatile memory is formed.

Figure 14:
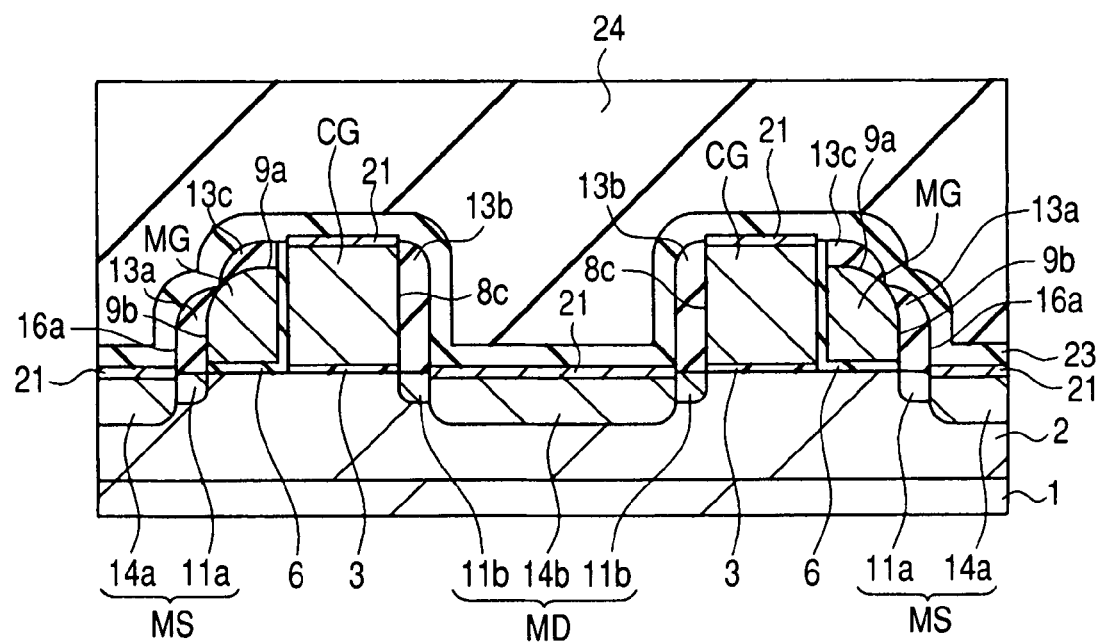
FIG. 14 is a fragmentary cross-sectional view of the semiconductor device during a manufacturing step thereof following that of FIG. 13.

As illustrated in FIG. 14, an insulating film 23 and an insulating film 24 are formed (deposited) successively all over the main surface of the semiconductor substrate 1 so as to cover therewith the control gate electrode CG and memory gate electrode MG. The upper surface of the insulating film 24 is then planarized if necessary by CMP (Chemical Mechanical Polishing) or the like method.

The insulating film 23 is made of a silicon nitride film and the insulating film 24 is made of a silicon oxide film and they can be formed using CVD or the like. The insulating film 23 is thinner than the insulating film 24. The insulating film 24 which is thicker functions as an interlayer insulating film, while the insulating film 23 (silicon nitride film) which is thinner functions as an etching stopper film during the formation of a contact hole in the insulating film 24.

Figure 15:
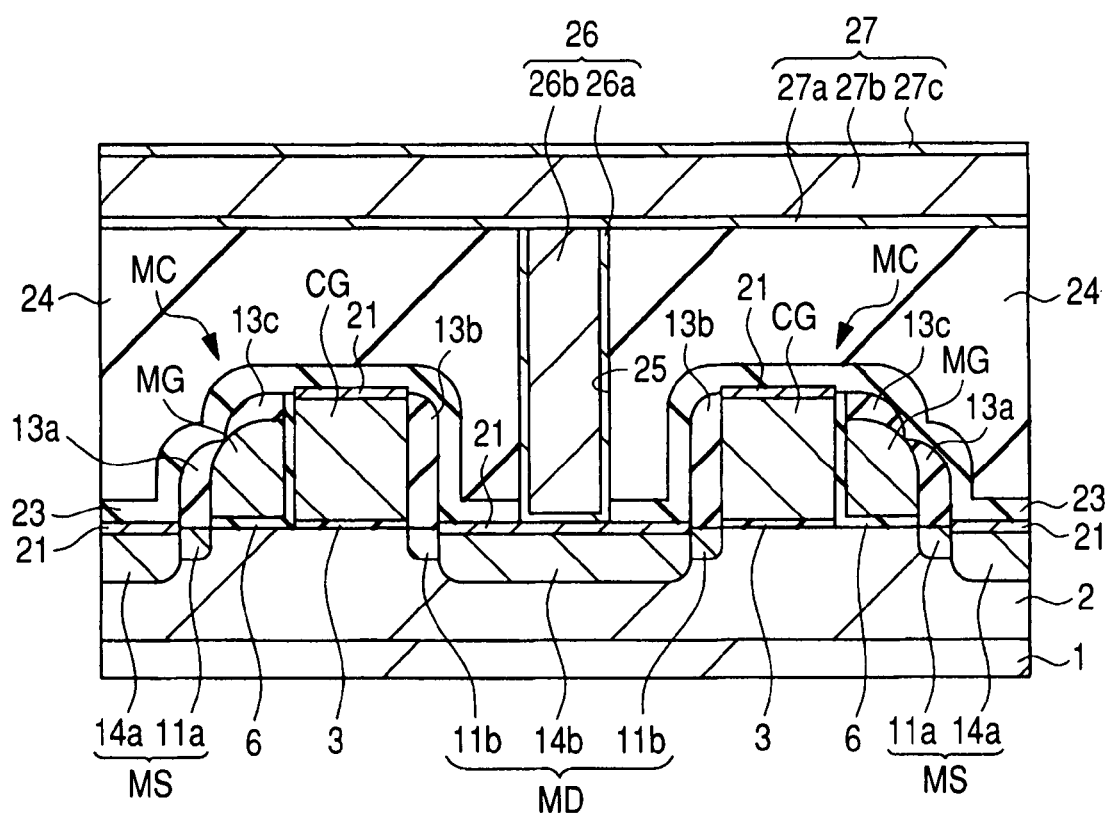
FIG. 15 is a fragmentary cross-sectional view of the semiconductor device during a manufacturing step thereof following that of FIG. 14.

As illustrated in FIG. 15, with a photoresist pattern (not illustrated) formed over the insulating film 24 by photolithography as an etching mask, the insulating film 24 and insulating film 23 are dry etched to form a contact hole (opening portion, through-hole) 25 in the insulating films 23 and 24. The contact hole 25 penetrating through the insulating films 23 and 24 is formed by dry etching the insulating film 24 while allowing the insulating film 23 to serve as an etching stopper film, and removing the insulating film 23 from the bottom of the contact hole 25 by dry etching. By allowing the insulating film 23 to act as an etching stopper during the etching of the insulating film (interlayer insulating film) 24, the damage of the underlying layer by excessive etching or deterioration in the size accuracy in etching can be avoided upon formation of the contact hole 25 by etching.

The contact hole 25 is formed over the upper portions of the n⁺ type semiconductor regions 14a and 14b, control gate electrode CG, memory gate electrode MG, and the like. From the bottom portion of the contact hole 25, a portion of the main surface of the semiconductor substrate 1, for example, a portion of the n⁺ type semiconductor regions 14a and 14b (the metal silicide film 21 over the surface thereof), a portion of the control gate electrode CG (the metal silicide film 21 over the surface thereof) or a portion of the memory gate electrode MG is exposed. In the cross-sectional view of FIG. 15, the cross-section of a portion of the n⁺ type semiconductor region 14b (the metal silicide film 21 over the surface thereof) exposed from the bottom of the contact hole 25 is illustrated.

A plug 26 made of tungsten (W) is then formed in the contact hole 25. The plug 26 can be formed, for example, by forming a conductive barrier film (such as titanium nitride film) 26a over the insulating film 24 including the inside of the contact hole 25, forming a tungsten film 26b over the barrier film 26a by CVD or the like so as to bury it in the contact hole 25, and removing unnecessary portions of the tungsten film 26b and barrier film 26a over the insulating film 24 by CMP or etchback.

Over the insulating film 24 having the plug 26 buried therein, an interconnect (first interconnect layer) 27 is formed. The interconnect 27 can be formed by forming a barrier conductor film 27a, an aluminum film 27b, and a barrier conductor film 27c successively by sputtering and then patterning them by photolithography and dry etching. The barrier conductor films 27a and 27c are made of, for example, a titanium film or a titanium nitride film, or a film stack of them. The aluminum film 27b is a conductor film composed mainly of aluminum such as a single substance of aluminum (Al) or an aluminum alloy. The interconnect 27 is electrically coupled, via the plug 26, to the source region (semiconductor region MS) of the memory transistor, drain region (semiconductor region MD) of the control transistor, the control gate electrode CG or the memory gate electrode MG. The interconnect 27 is not limited to an aluminum interconnect as described above and various ones can be employed instead. For example, a tungsten interconnect or a copper interconnect (for example, a buried copper interconnect formed by the damascene process) can be used. Subsequently, an interlayer insulating film or upper interconnect layer is formed, but the description on it is omitted here. As a second-level interconnect and upper interconnects thereof, a buried copper interconnect formed by the damascene process may be employed.

The advantages of this Embodiment will next be described more specifically.

Figure 16:
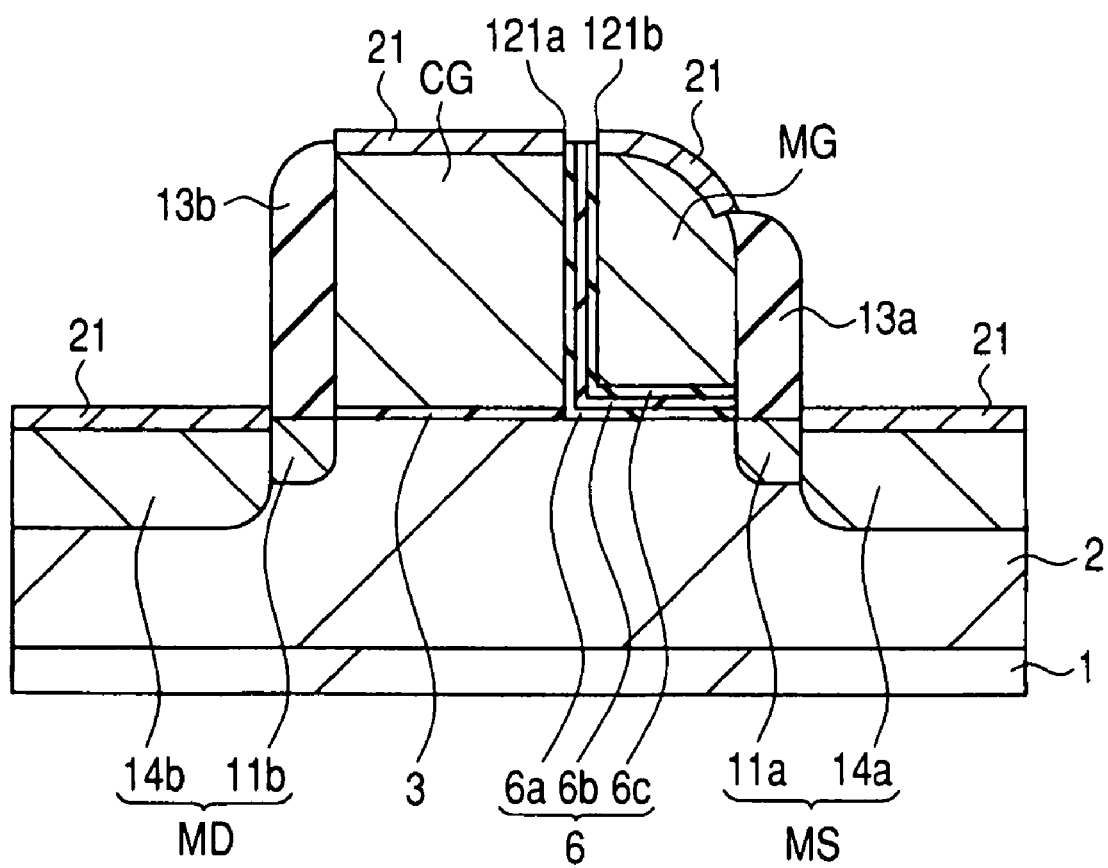
FIG. 16 is a fragmentary cross-sectional view of a semiconductor device according to Comparative Example.

FIG. 16 is a fragmentary cross-sectional view of a semiconductor device according to Comparative Example and it corresponds to FIG. 1 of this Embodiment. In order to facilitate understanding of the diagram, the insulating films 23 and 24 are omitted from FIG. 16.

The semiconductor device of Comparative Example as illustrated in FIG. 16 is different from that of this Embodiment and the height of the control gate electrode CG and that of the memory gate electrode MG are equal and the metal silicide film 21 is formed not only over the upper portion of the control gate electrode CG but also over the upper portion of the memory gate electrode MG. Different from the device of this Embodiment, the device having such a structure is available by forming the control gate electrode CG and the memory gate electrode MG with the same height in the etchback step of the conductor film 7 of FIG. 8 for this Embodiment. Since the sidewall insulating film 13c is therefore not formed over the memory gate electrode MG in the etchback step of the insulating film 12 illustrated in FIG. 11, the metal silicide film 21 is formed also over the upper portion of the memory gate electrode MG in the step of forming the metal silicide film 21 in FIGS. 12 and 13.

In the semiconductor device of Comparative Example illustrated in FIG. 16, the metal silicide film 21 over the control gate electrode CG is insulated and isolated from the metal silicide film 21 over the memory gate electrode MG by the insulating film 6 which is an ONO film. The insulating film 6 is however thin so that the end portion 121a of the metal silicide film 21 over the control gate electrode CG comes close to the end portion 121b of the metal silicide film 21 over the memory gate electrode MG and there is a possibility of occurrence of a short-circuit fault between the control gate electrode CG and memory gate electrode MG. The short-circuit between the control gate electrode CG and memory gate electrode MG occurs depending on the formation state of the metal silicide film 21 over the control gate electrode CG and memory gate electrode MG. It occurs when the metal silicide film 21 over the control gate electrode CG and the metal silicide film 21 over the memory gate electrode MG approach each other in a bridge-like form. The semiconductor device having such a short-circuit fault must be selected and removed according to a test performed in the manufacture of semiconductor devices. Such a defect may deteriorate the production yield of the semiconductor device and increases the cost (unit cost) of it.

Formation of no metal silicide film 21 over both the control gate electrode CG and memory gate electrode MG, different from this Embodiment, can be given as one measure for preventing such a defect. If no metal silicide film 21 is formed over the control gate electrode CG, the withstand voltage between the control gate electrode CG and memory gate electrode MG can be improved and occurrence of short-circuit fault can be prevented, but the resistance of the control gate electrode CG increases, leading to a reduction in the operation speed of the memory.

In this Embodiment, on the other hand, as illustrated in FIGS. 1 and 2, the metal silicide film 21 is formed over the control gate electrode CG, but no metal silicide film 21 is formed over the memory gate electrode MG. In particular, the metal silicide film 21 is not formed at least the end portion (end portion adjacent to the control gate electrode CG via the insulating film 6) and nearby region thereof, on the side of the control gate electrode CG, of the surface (upper surface 9a and sidewall 9b) of the memory gate electrode MG not in contact with the insulating film 6. Since no metal silicide film is formed over the memory gate electrode MG (particularly, over the end portion of the upper surface 9a of the memory gate electrode MG on the side of the control gate electrode CG and nearby region of the end portion), the metal silicide film 21 over the control gate electrode CG is not brought close to the memory gate electrode MG, whereby occurrence of a short-circuit fault between the control gate electrode CG and memory gate electrode MG can be prevented. This leads to an improvement in the production yield of a semiconductor device and reduction in the cost (unit price) of the semiconductor device. This also leads to an improvement in the withstand voltage between the control gate electrode CG and memory gate electrode MG, thereby improving the reliability and performance of the semiconductor device.

Moreover, in this Embodiment, the metal silicide film 21 is not formed over the memory gate electrode MG but over the control gate electrode CG. This makes it possible to reduce the resistance of the control gate electrode CG and improve the operation speed of the memory.

This Embodiment relates to a nonvolatile memory. The memory gate electrode MG of the memory transistor for storing data while retaining charges is fixed to a predetermined voltage at the time of memory operation so that it is not necessary to reduce the resistance so much as required by the control gate electrode CG. Even if a metal silicide film is not formed over the memory gate electrode MG as in this Embodiment, no trouble in memory operation therefore occurs.

In this Embodiment, a step difference is formed between the upper surface of the control gate electrode CG and the upper surface of the memory gate electrode MG by adjusting the height of the memory gate electrode MG lower than that of the control gate electrode CG. By forming such a step difference, the sidewall insulating film 13c can be formed over the upper portion of the memory gate electrode MG when the sidewall insulating films 13a and 13b are formed over the sidewalls of the memory gate electrode MG and control gate electrode CG, respectively. This makes it possible to prevent the formation of the metal silicide film 21 over the upper portion of the memory gate electrode MG in the silicidation step. Without any special step, therefore, it is possible to actualize a structure in which the metal silicide film 21 has been formed over the control gate electrode CG but not over the memory gate electrode MG and this enables a reduction in the number of manufacturing steps and manufacturing cost of the semiconductor device.

Moreover, in this Embodiment, description was made mainly of the case where the surface (upper surface 9a and sidewall 9b) of the memory gate electrode MG not in contact with the insulating film 6 is covered with the sidewall insulating film 13c and sidewall insulating film 13a and the metal silicide film 21 is not formed over the surface of the memory gate electrode MG. As another embodiment, it is possible to expose the surface of the memory gate electrode MG between the sidewall insulating film 13c and sidewall insulating films 13a and form the metal silicide film 21 over the exposed surface (over the surface of the memory gate electrode MG exposed between the sidewall insulating film 13c and 13a).

As is apparent from the semiconductor device of Comparative Example as illustrated in FIG. 16, a short-circuit fault occurs between the control gate electrode CG and memory gate electrode MG when the end portion 121a of the metal silicide film 21 over the control gate electrode CG comes close to the end portion 121b of the metal silicide film 21 over the memory gate electrode MG. Even if the surface of the memory gate electrode MG is exposed between the sidewall insulating film 13c and sidewall insulating film 13a and the metal silicide film 21 is formed over the exposed surface, the metal silicide film 21 is sufficiently distant from the control gate electrode CG so that a reduction in the withstand voltage or a short-circuit fault hardly occurs.

In the semiconductor-device according to this Embodiment, the metal silicide film 21 is not formed over at least the end portion (that is, the end portion adjacent to the control gate electrode CG via the insulating film 6) or nearby region thereof, on the control gate electrode CG, of the surface (upper surface 91 and sidewall 9b) of the memory gate electrode MG not in contact with the insulating film 6. It is therefore preferred not to form the metal silicide film 21 over the upper surface 9a of the memory gate electrode MG, but the metal silicide film 21 can be formed over the surface of the memory gate electrode MG in a region (region between the sidewall insulating film 13c and sidewall insulating film 13a) distant from the control gate electrode CG.

In this Embodiment, the height $h_5$ of the memory gate electrode MG is made lower than the height $h_4$ of the control gate electrode CG as illustrated in FIG. 8, whereby the upper portions of the end portion and nearby region thereof, on the side of the control gate electrode CG, of the surface (upper surface 9a and sidewall 9b) of the memory gate electrode MG not in contact with the insulating film 6 can be covered with the sidewall insulating film 13c as illustrated in FIG. 11. When the metal silicide film 21 is formed by the silicidation process, the formation of the metal silicide film 21 over the end portion and nearby region thereof, on the side of the control gate electrode CG, of the surface (upper surface 9a and sidewall 9b) of the memory gate electrode MG not in contact with the insulating film 6 can be prevented as illustrated in FIG. 13, leading to prevention of occurrence of a short-circuit fault between the control gate electrode CG and memory gate electrode MG and improvement of the withstand voltage.

Embodiment 2

Figure 17:
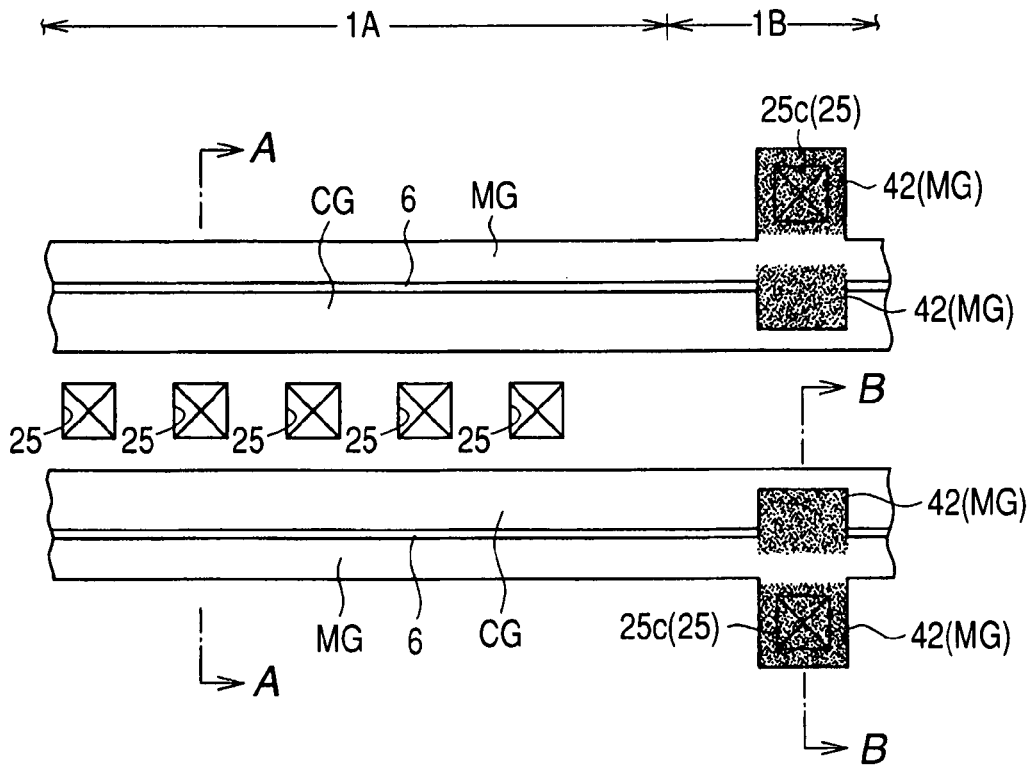
FIG. 17 is a fragmentary plan view of a semiconductor device according to another embodiment of the present invention.
Figure 18:
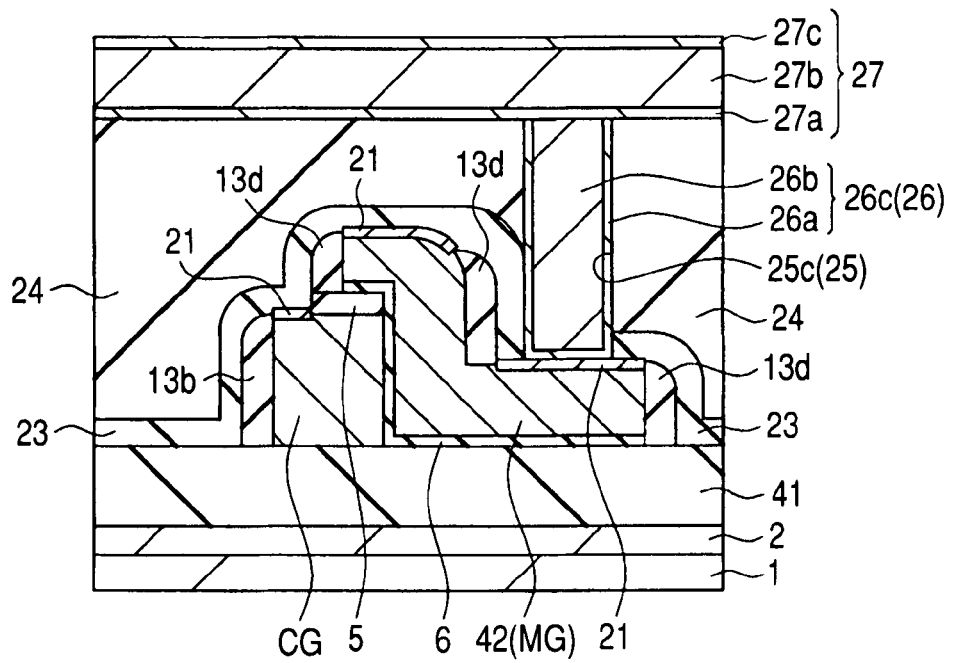
FIG. 18 is a fragmentary cross-sectional view of the semiconductor device according to the another embodiment of the present invention.

FIG. 17 is a fragmentary plan view of a semiconductor device according to this Embodiment; FIG. 18 is a fragmentary cross-sectional view thereof. The cross-sectional view taken along a line A-A of FIG. 17 substantially corresponds to FIG. 15 of Embodiment 1, while the cross-sectional view taken along a line B-B of FIG. 17 substantially corresponds to FIG. 18. FIG. 17 is a plan view but in order to facilitate understanding, a region of the memory gate electrode MG in which the metal silicide film 21 has been formed is marked with dots.

In a memory cell region (memory cell formation region, memory cell array formation region) 1A of a semiconductor substrate 1, a plurality of memory cells MC as described in Embodiment 1 are disposed in array arrangement. In the memory cell region 1A, each memory gate electrode MG is formed like a sidewall spacer over the sidewall of a control gate electrode CG via an insulating film 6. In a contact portion formation region (memory gate contact formation region) 1B of the semiconductor substrate 1, the memory gate electrode MG is coupled to a contact hole 25 and a plug 26 buried therein in order to enable the supply of a predetermined voltage to each memory gate electrode MG. Since the sidewall-spacer like portion cannot easily be coupled to the plug 26, they are coupled to each other after a pattern having a flat portion is provided in the memory gate electrode MG in the contact portion formation region 1B as illustrated in FIGS. 17 and 18 and the contact hole 25 and plug 26 buried therein are placed over the flat portion of the pattern.

As described in Embodiment 1, in this Embodiment 2, the metal silicide film 21 is formed over the control gate electrode CG and the metal silicide film 21 is not formed over the memory gate electrode MG. In the contact portion formation region 1B of the memory gate electrode MG to be coupled to the plug 26, the metal silicide film 21 is formed and the metal silicide film 21 is not formed over the memory gate electrode MG of the other region. The plug 26 to be coupled to the memory gate electrode MG is coupled to the memory gate electrode MG via the metal silicide film 21 so that the contact resistance of the plug 26 to be coupled to the memory gate electrode MG can be reduced. A reduction in the contact resistance of the memory gate electrode MG leads to an improvement in the operation speed of a nonvolatile memory and improvement in the performance of the semiconductor device. In a region of the memory gate electrode MG other than a region to be coupled to the plug 26 (contact hole 25), the metal silicide film 21 is not formed so that occurrence of a short-circuit fault between the control gate electrode CG and memory gate electrode MG can be prevented and a withstand voltage between the control gate electrode CG and memory gate electrode MG can be improved.

Figure 19:
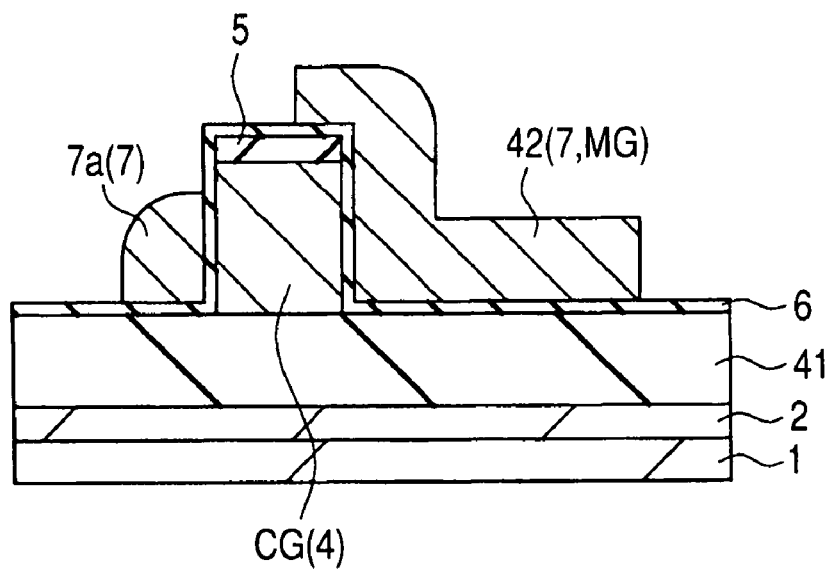
FIG. 19 is a fragmentary cross-sectional view of the semiconductor device according to the another embodiment of the present invention during a manufacturing step thereof.
Figure 20:
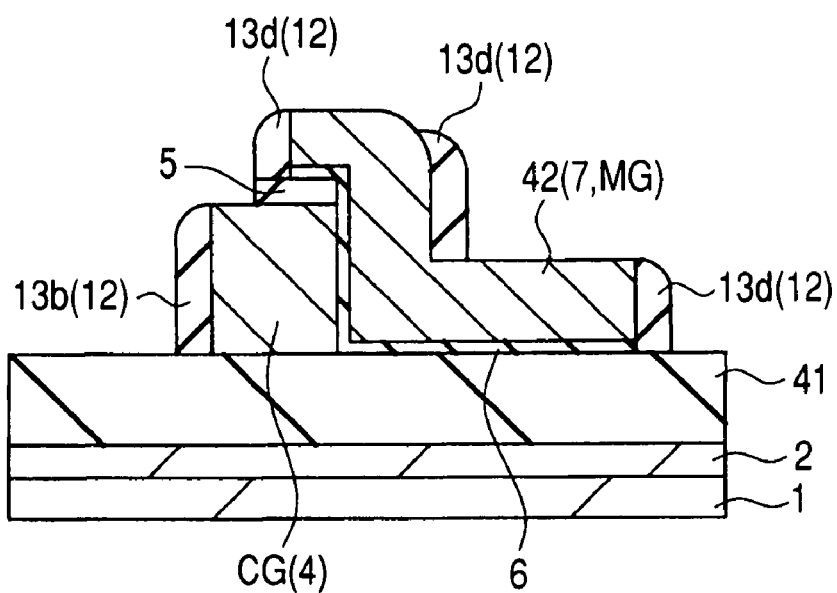
FIG. 20 is a fragmentary cross-sectional view of the semiconductor device during a manufacturing step thereof following that of FIG. 19.
Figure 21:
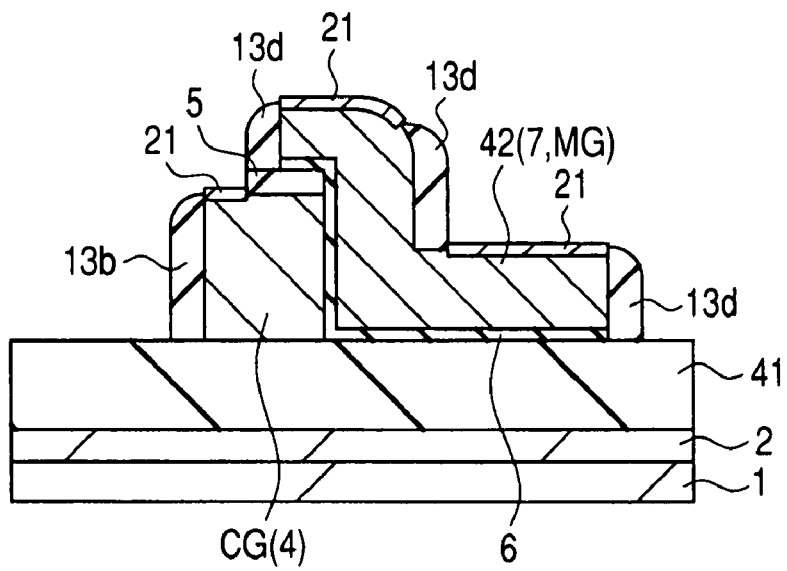
FIG. 21 is a fragmentary cross-sectional view of the semiconductor device during a manufacturing step thereof following that of FIG. 20.

FIGS. 19 to 21 are fragmentary cross-sectional views of the semiconductor device of this Embodiment during the manufacturing steps thereof and regions corresponding to those of FIG. 18 are illustrated. The step of FIG. 19 corresponds to the step of FIG. 8 in Embodiment 1; the step of FIG. 20 corresponds to the step of FIG. 11 in Embodiment 1; and the step of FIG. 21 corresponds to the step of FIG. 13 in Embodiment 1.

Prior to the formation of a p well 2, an element isolation region 41 is formed in the contact portion formation region 1B of the semiconductor substrate 1 by STI (Shallow Trench Isolation), LOCOS (Local Oxidization of Silicon) or the like method. In the contact portion formation region 1B, therefore, the control gate electrode CG and memory gate electrode MG are formed over the element isolation region 41.

After the steps of FIGS. 5 to 7 in Embodiment 1, an etching mask layer (not illustrated) made of a photoresist layer or the like is formed over the conductor film 7 prior to the etchback of the conductor film 7 as illustrated in FIG. 8 and in the etchback step of the conductor film 7 in FIG. 8, the conductor film 7 is left below the etching mask layer. In the memory cell region 1A, the memory gate electrode MG has a sidewall-space like form, while in the contact portion formation region 1B, the contact portion 42 of the memory gate electrode MG is integrated with the memory gate electrode MG as illustrated in FIG. 19 due to the conductor film 7 left below the etching mask layer. The contact portion 42 of the memory gate electrode MG extends with almost an equal thickness from the upper portion of the control gate electrode CG to the element isolation region 41 and a portion extending over the element isolation region 41 has almost a flat upper surface.

Steps of FIGS. 9 to 11 in Embodiment 1 are then performed, whereby a structure as illustrated in FIG. 20 can be obtained. In the contact portion formation region 1B, a sidewall insulating film 13d made of the remaining insulating film 12 is formed over the sidewalls of the contact portion 42 of the memory gate electrode MG as illustrated in FIG. 20, but the insulating film 12 does not remain over the flat portion (portion extending over the element isolation region 41 and a portion extending over the control gate electrode CG) of the contact portion 42 of the memory gate electrode MG so that the upper surface is exposed.

Steps of FIGS. 12 and 13 in Embodiment 1 are then performed to form a structure as illustrated in FIG. 21. As illustrated in FIG. 20, in the contact portion formation region 1B, a metal film 17 is deposited over the exposed surface of the flat portion (the portion extending over the element isolation region 41 and the portion extending over the control gate electrode CG) of the contact portion 42 of the memory gate electrode MG, followed by heat treatment for silicidation. As illustrated in FIG. 21, in the contact portion formation region 1B, therefore, the metal silicide film 21 is formed over the flat portion (the portion extending over the element isolation region 41 and portion extending over the control gate electrode CG) of the contact portion 42 of the memory gate electrode MG as illustrated in FIG. 21.

The steps of FIGS. 14 and 15 in Embodiment 1 are then performed to obtain the structure as illustrated in FIG. 18. Of the contact holes 25 and plugs 26 to fill therein, the contact hole 25c to be coupled to the memory gate electrode MG and the plug 26c to fill therein are formed over the flat portion (portion extending over the element isolation region 41) of the contact portion 42 of the memory gate electrode MG. When the contact hole 25c and plug 26c are formed, the metal silicide film 21 over the contact portion 42 of the memory gate electrode MG is exposed from the bottom of the contact hole 25c and the exposed metal silicide film 21 is coupled to the plug 26c.

As described above, in this Embodiment, the metal silicide film 21 is formed over the region (contact portion 42) of the memory gate electrode MG to be coupled to (contacted with) the plug 26c. The plug 26c is a conductor portion which is formed in the contact hole 25c formed (opened) in the insulating films 23 and 24 (interlayer insulating films) formed to cover therewith the control gate electrode CG, memory gate electrode MG and sidewall insulating films 13a, 13b and 13c and is electrically, coupled to the memory gate electrode MG.

This plug enables reduction in the contact resistance between the memory gate electrode MG and plug 26c. By employing a similar structure to that formed in Embodiment 1 except for the region (contact portion 42) of the memory gate electrode MG to be coupled to the plug 26 (contact hole 25), the short-circuit between the control gate electrode CG and memory gate electrode MG can be prevented, whereby a withstand voltage can be improved.

Embodiment 3

Figure 22:
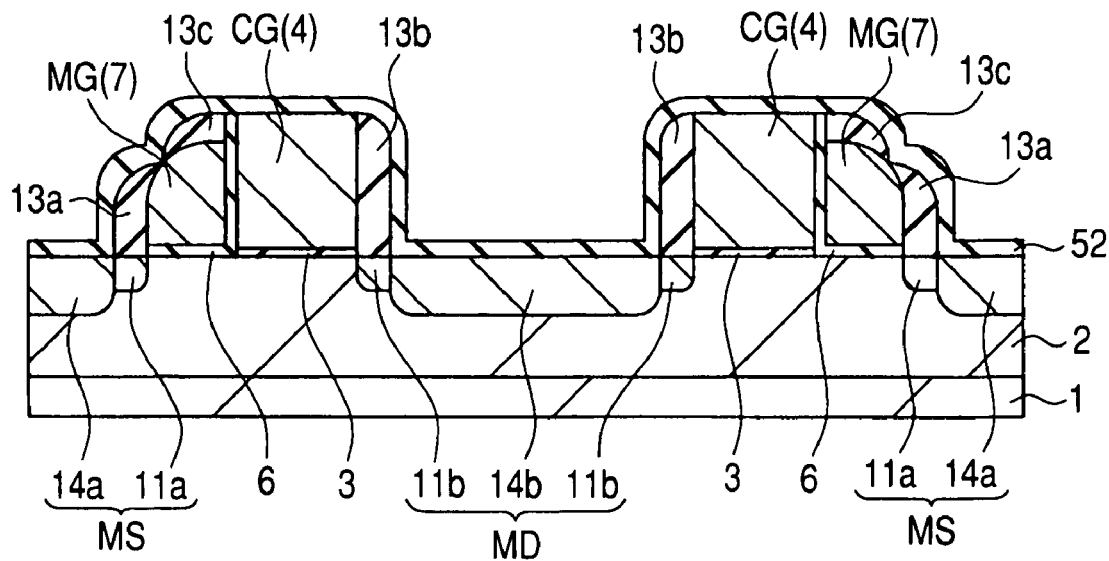
FIG. 22 is a fragmentary cross-sectional view of a semiconductor device according to a further embodiment of the present invention during a manufacturing step thereof.
Figure 23:
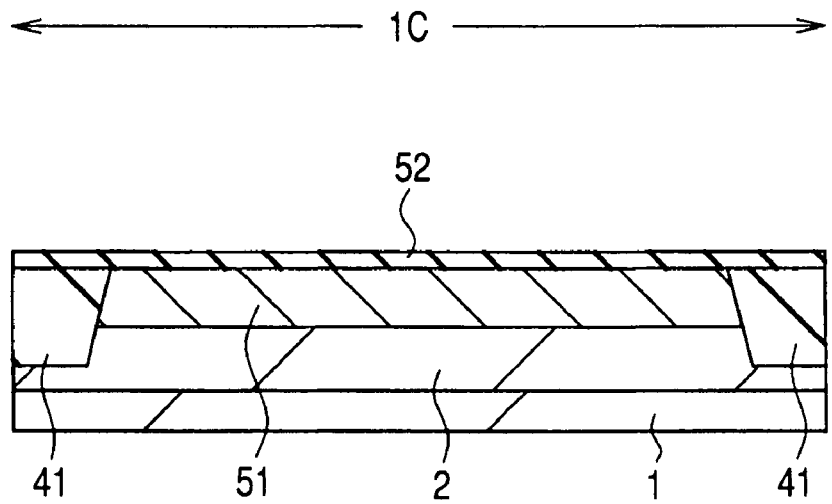
FIG. 23 is a fragmentary cross-sectional view of a resistive element formation region of the semiconductor device during the same manufacturing step as that of FIG. 22.
Figure 24:
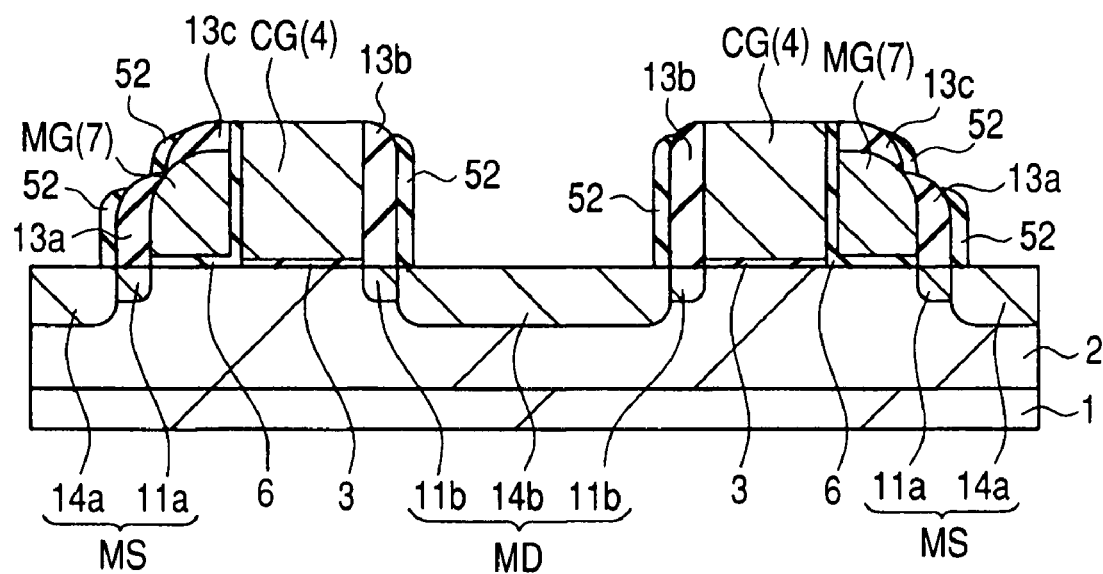
FIG. 24 is a fragmentary cross-sectional view of the semiconductor device during a manufacturing step thereof following that of FIG. 22.
Figure 25:
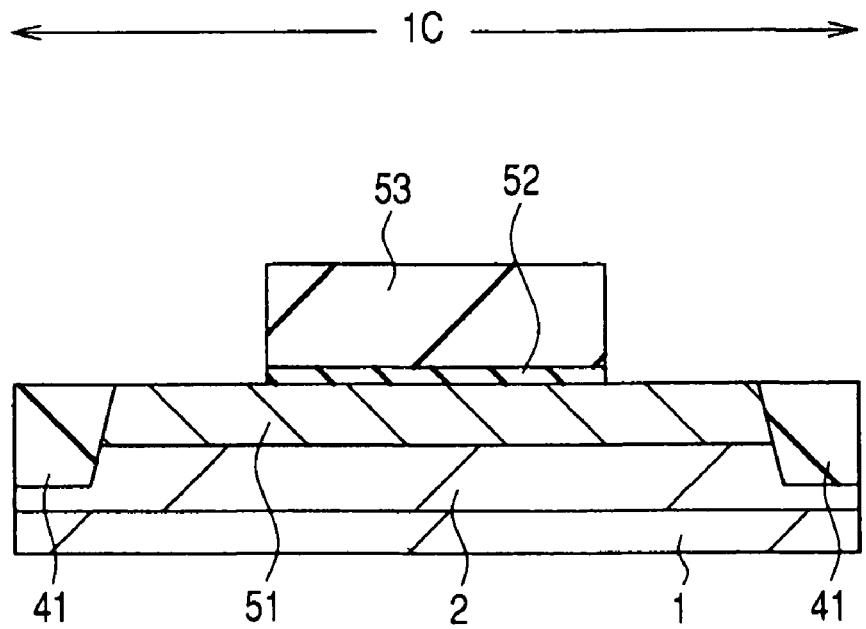
FIG. 25 is a fragmentary cross-sectional view of a resistive element formation region of the semiconductor device during the same manufacturing step as that of FIG. 24.
Figure 26:
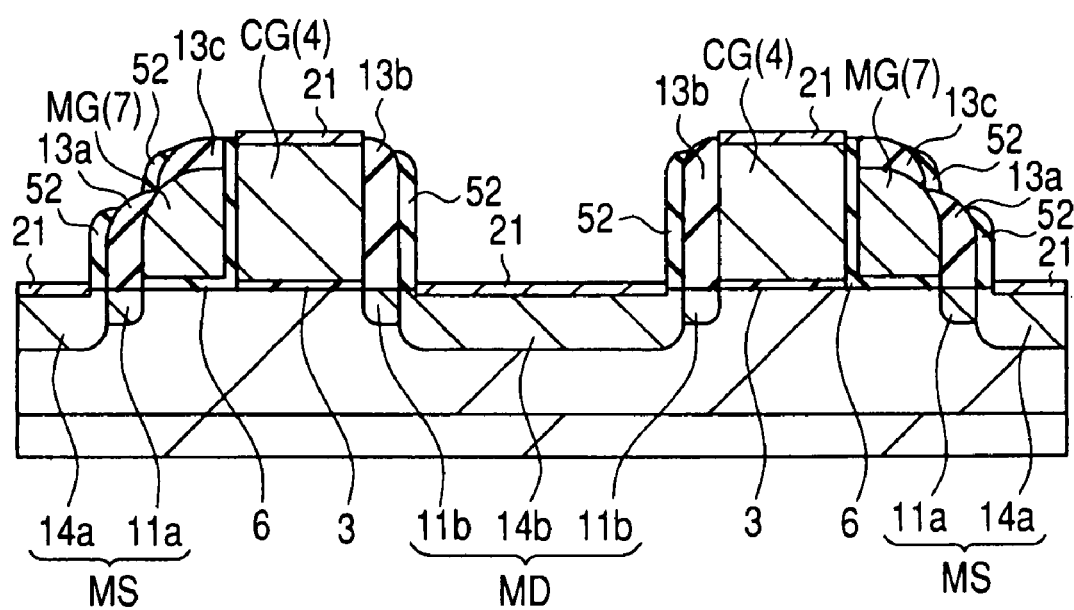
FIG. 26 is a fragmentary cross-sectional view of the semiconductor device during a manufacturing step thereof following that of FIG. 24.
Figure 27:
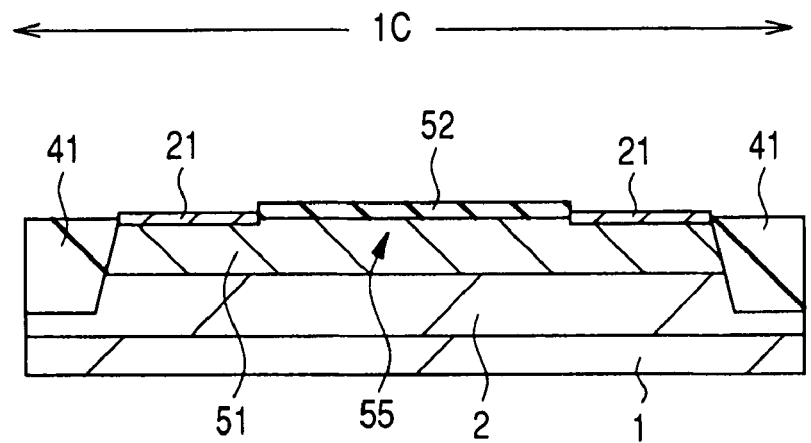
FIG. 27 is a fragmentary cross-sectional view of a resistive element formation region of the semiconductor device during the same manufacturing step as that of FIG. 26.
Figure 28:
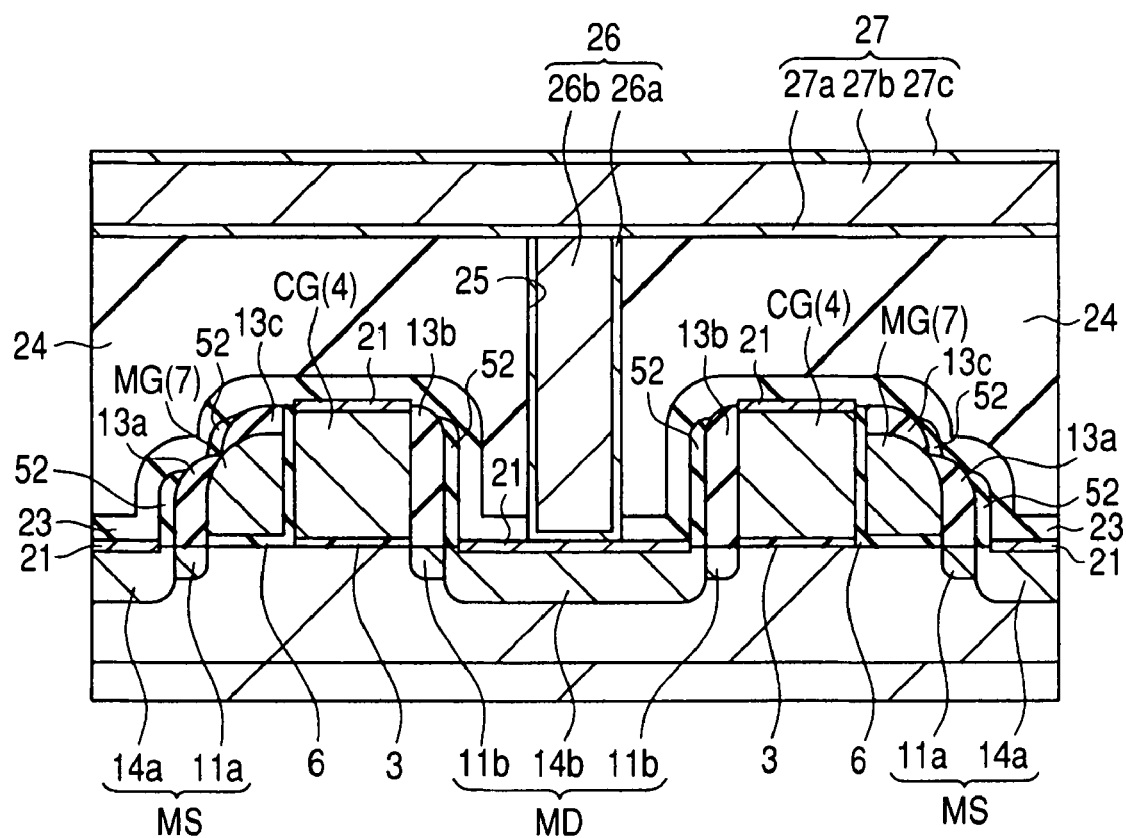
FIG. 28 is a fragmentary cross-sectional view of the semiconductor device during a manufacturing step thereof following that of FIG. 26.
Figure 29:
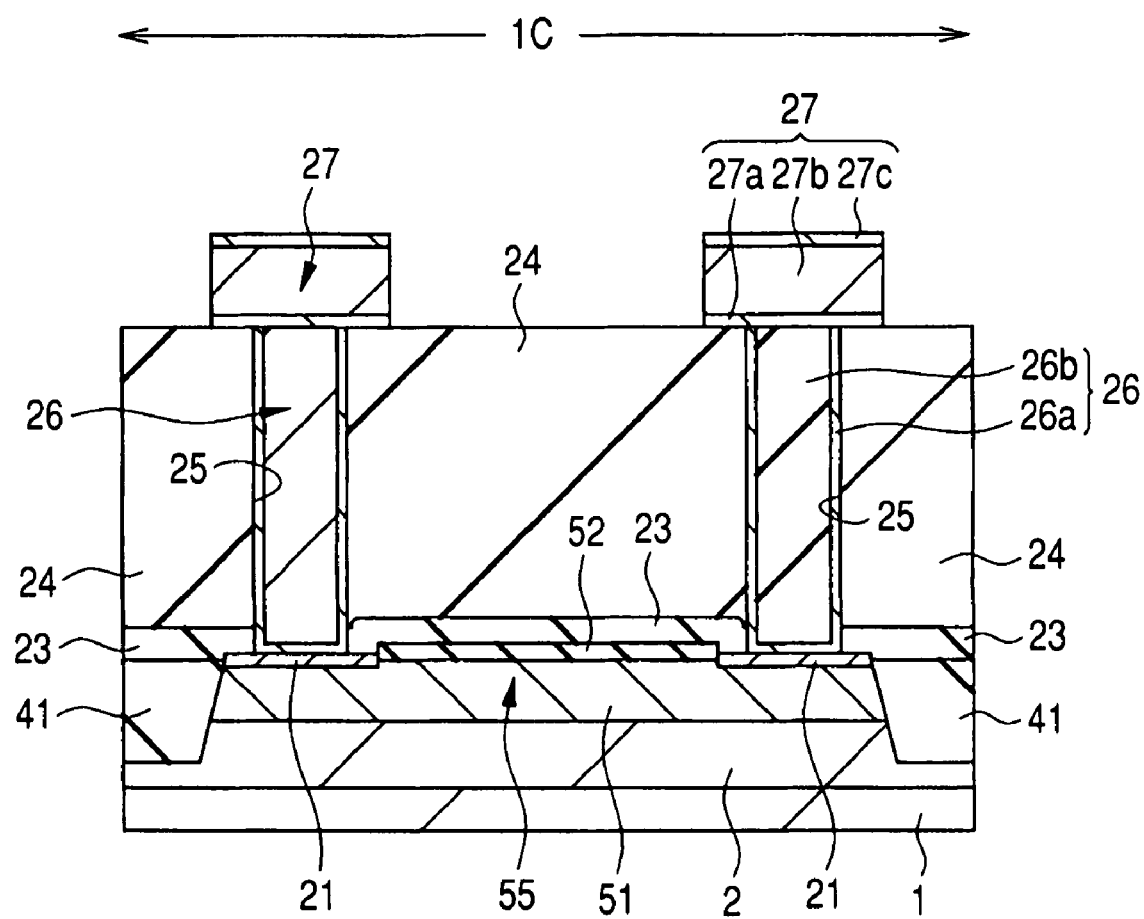
FIG. 29 is a fragmentary cross-sectional view of a resistive element formation region of the semiconductor device during the same manufacturing step as that of FIG. 28.

FIGS. 22 to 29 are fragmentary cross-sectional views of a semiconductor device according to this Embodiment during its manufacturing steps. Of FIGS. 22 to 29, FIGS. 22, 24, 26 and 28 illustrate a region (memory cell formation region) corresponding to that illustrated in FIGS. 5 to 16 of Embodiment 1 and FIGS. 23, 25, 27 and 29 show a resistive element formation region 1C. FIGS. 22 and 23 show the same step stage; FIGS. 24 and 25 show the same step stage; FIGS. 26 and 27 show the same step stage; and FIGS. 28 and 29 show the same step stage.

In Embodiment 3, a memory cell of a nonvolatile memory is formed in a memory cell region of a semiconductor substrate 1 and a resistive element is formed in the resistive element formation region 1C of the semiconductor substrate 1.

After formation of the structure of Embodiment 1 as illustrated in FIG. 11, an insulating film 52 is formed all over the main surface of the semiconductor substrate 1 to cover the control gate electrode CG, memory gate electrode MG and sidewall insulating films 13a, 13b and 13c. The insulating film 52 is made of, for example, a silicon oxide film and can be formed by CVD or the like method.

As illustrated in FIG. 23 which illustrates the same step stage as that of FIG. 22, prior to the formation of the insulating film 52, an element isolation region 41 is formed to define an active region in the resistive element formation region 1C of the semiconductor substrate 1; a p well 2 is formed in this active region; and an n type semiconductor region 51 is formed by ion implantation into the p well 2 of the resistive element formation region 1C. The impurity concentration of the n type semiconductor region 51 is adjusted so that the resistive element has a predetermined resistance. The insulating film 52 is therefore formed over the n type semiconductor region 51 as illustrated in FIG. 23 in the resistive element formation region 1C.

After deposition of the insulating film 52, a photoresist pattern 53 is formed over the insulating film 52 in the resistive element formation region 1C as illustrated in FIG. 25 by using photolithography. As illustrated in FIGS. 24 and 25, the insulating film 52 is etched back (etched, anisotropically etched) by anisotropic etching technique, whereby the insulating film 52 below the photoresist pattern 53 of the resistive element formation region 1C is left locally, the insulating film 52 over the sidewall (side surface) and upper portion of the memory gate electrode MG and over the sidewall of the control gate electrode CG is left in the form of a sidewall spacer (sidewall insulating film) locally and the insulating film 52 is removed from the other region. The photoresist pattern 53 is then removed.

Then, steps corresponding to those of Embodiment 1 as illustrated in FIGS. 12 and 13 are performed. Described specifically, after exposing the surfaces of the n$^+$ type semiconductor regions 14a and 14b, the upper surface (surface) of the control gate electrode CG and the surface of the n type semiconductor region not covered with the insulating film 52 in the resistive element formation region 1C by etching (for example, wet etching with dilute hydrofluoric acid) if necessary, a metal film 17 (not illustrated in FIGS. 26 and 27) similar to that of Embodiment 1 is formed (deposited) all over the main surface of the semiconductor substrate 1. The semiconductor substrate 1 is then heat treated to cause a reaction of the metal film 17 with the upper layer portions (surface layer portions) of the n⁺ type semiconductor regions 14a and 14b, control gate electrode CG and n type semiconductor region 51 not covered with the insulating film 52 to form the metal silicide film 21 over the n⁺ type semiconductor regions 14a and 14b, control gate electrode CG and n type semiconductor region 51 not covered with the insulating film 52. An unreacted portion of the metal film 17 is then removed.

In the resistive element formation region 1C, a resistive element 55 is formed from the n type semiconductor region 51 (that is, the n type semiconductor region 51 between the metal silicide films 21) below the insulating film 52, and the metal silicide film 21 is formed at the both ends of the resistive element 55 as a contact portion of the resistive element 55. The insulating film 52 is therefore an insulating film used for the formation of the metal silicide film 21 at the contact portion of the resistive element 55.

As illustrated in FIGS. 28 and 29, in a similar manner to that employed in Embodiment 1, insulating films 23 and 24 are then formed, a contact hole 25 is formed in the insulating films 23 and 24, a plug 26 made of a barrier film 26a and a tungsten film 26b is formed in the contact hole 25, and an interconnect 27 is formed over the insulating film 24 having the plug 26 buried therein. In the resistive element formation region 1C, as illustrated in FIG. 29, the contact hole 25 and plug 26 are formed over the metal silicide film 21 formed over the upper surface of the n type semiconductor region 51 not covered with the insulating film 52. The plug 26 comes into contact with the metal silicide film 21 over the resistive element 55 (n type semiconductor region 51) so that the contact resistance between the resistive element 55 and the plug 26 to be coupled thereto can be reduced.

In this Embodiment similar to Embodiment 1, the sidewall insulating film 13c is formed also over the upper portion (the upper surface 9a) of the memory gate electrode MG in the same step as that for the formation of the sidewall insulating films 13a and 13b over the sidewall 9b of the memory gate electrode MG and sidewall 8c of the control gate electrode CG. In Embodiment 3, then, the deposition of the insulating film 52 and anisotropic etching of the insulating film 52 are performed to leave the insulating film 52 locally over the upper portion of the memory gate electrode MG. Even if a portion of the sidewall insulating film 13c is removed in various steps after the formation of the sidewall insulating film 13c, the sidewall insulating film 13c is reinforced by the insulating film 52 and exposure of the upper surface 9a of the memory gate electrode MG before the formation of the metal film 17 can be prevented. When the metal film 17 is formed, the upper surface 9a of the memory gate electrode MG and the metal film 17 have therebetween not only the sidewall insulating film 13c but also the insulating film 52 so that a reaction between the upper surface 9a of the memory gate electrode MG and the metal film 17, which will otherwise be caused by the heat treatment, can be prevented completely, thereby preventing the formation of the metal silicide film 21 over the upper surface 9a of the memory gate electrode MG more efficiently. This makes it possible to prevent occurrence of a short-circuit fault between the control gate electrode CG and memory gate electrode MG and improve the withstand voltage.

In the etching step of the insulating film 52, the insulating film 52 is left locally in the resistive element formation region 1C and the metal silicide film 21 is formed over the surface of the n type semiconductor region 51 (resistive element 55) not covered with the insulating film 52, that is, the contact portion of the resistive element 55. The insulating film 52 is therefore an insulating film to be used for the formation of the metal silicide film 21 at the contact portion of the resistive element 55. In this Embodiment, the insulating film 52 is left locally in the form of a sidewall spacer over the upper portion of the memory gate electrode MG so that the sidewall insulating film 13c can be reinforced with the insulating film 52 without addition of any special step. Accordingly, prevention of a short-circuit fault between the control gate electrode CG and memory gate electrode MG and improvement of a withstand voltage can be actualized more effectively without increasing the number of manufacturing steps of the semiconductor device.

The inventions made by the present inventors were described specifically based on their embodiments. The present invention is however not limited to or by them. It is needless to say that these embodiments can be modified variously without departing from the scope of the invention.

The present invention is suitable for application to a semiconductor device having a nonvolatile memory and a manufacturing method thereof.

What is claimed is:

1. A manufacturing method of a semiconductor device, comprising the steps of:
   (a) forming a first gate electrode over the main surface of a semiconductor substrate via a first insulating film;
   (b) forming, over the main surface of the semiconductor substrate and sidewall of the first gate electrode, a second insulating film having therein a charge accumulator portion;
   (c) forming, over the second insulating film, a second gate electrode adjacent to the first gate electrode via the second insulating film, wherein the second gate electrode is formed with a height smaller than that of the first gate electrode;
   (d) after the step (c), forming a third insulating film over the main surface of the semiconductor substrate to cover the first and second gate electrodes;
   (e) after the step (d), etching back the third insulating film to leave the third insulating film over the upper portion and sidewall of the second gate electrode and over the sidewall of the first gate electrode, and then removing the third insulating film of the other region;
   (f) after the step (e), forming a metal film over the main surface of the semiconductor substrate to cover the first and second gate electrodes and the third insulating film; and
   (g) after the step (f), reacting the first gate electrode with the metal film to form the metal silicide film over the upper surface of the first gate electrode,
   wherein the third insulating film formed over the upper portion of the second gate electrode is kept during the steps (f) and (g).

2. A manufacturing method of a semiconductor device according to claim 1, wherein the step (c) comprises the sub-steps of:
   (c1) forming a first conductor film for the second gate electrode over the main surface of the semiconductor substrate to cover the first gate electrode; and
   (C2) etching back the first conductor film to leave, over the sidewall of the first gate electrode, the first conductor film via the second insulating film and remove the first conductor film from the other region, wherein in the step (c2), the first conductor film is etched back until the height of the first conductor film remaining over the sidewall of the first gate electrode via the second insulating film becomes lower than that of the first gate electrode.

3. A manufacturing method of a semiconductor device according to claim 1, further comprising, after the step (e) but before the step (f), the step of:

(h) implanting ions into the semiconductor substrate, by using the third insulating film formed over the sidewall of the first gate electrode and the sidewall of the second gate electrode as an ion injection blocking mask.

4. A manufacturing method of a semiconductor device according to claim 3, wherein semiconductor regions for source and drain are formed in the semiconductor substrate by the ion implantation in the step (h).

5. A manufacturing method of a semiconductor device according to claim 1, further comprising, after the step (e) but before the step (f), the steps of:

(i) forming a fourth insulating film over the main surface of the semiconductor substrate to cover the first and second gate electrodes and the third insulating film, and;

(j) etching the fourth insulating film to leave the fourth insulating film over the upper portion of the second gate electrode locally.

6. A manufacturing method of a semiconductor device according to claim 5, wherein in the step (i), the fourth insulating film is left locally also in a resistive element formation region of the semiconductor substrate.

7. A manufacturing method of a semiconductor device according to claim 1, wherein the metal silicide film is a cobalt silicide film.

8. A manufacturing method of a semiconductor device according to claim 1, wherein the charge accumulator portion is formed of a silicon nitride film.

9. A manufacturing method of a semiconductor device according to claim 1, wherein the third insulating film is formed of a silicon oxide film.

\* \* \* \* \*